United States Patent
Oh et al.

(10) Patent No.: US 10,552,554 B2
(45) Date of Patent: Feb. 4, 2020

(54) METHOD TO APPROXIMATE CHEMICAL POTENTIAL IN A TERNARY OR QUATERNARY SEMICONDUCTOR

(71) Applicant: SYNOPSYS, INC., Mountain View, CA (US)

(72) Inventors: Yong-Seog Oh, Pleasanton, CA (US); Ashutosh Kumar, San Jose, CA (US); Kyuho Lee, Albany, CA (US); Pratheep Balasingam, San Jose, CA (US)

(73) Assignee: SYNOPSYS, INC., Mountain View, CA (US)

( * ) Notice: Subject to any disclaimer, the term of this patent is extended or adjusted under 35 U.S.C. 154(b) by 584 days.

(21) Appl. No.: 14/863,358

(22) Filed: Sep. 23, 2015

(65) Prior Publication Data
US 2017/0083644 A1    Mar. 23, 2017

(51) Int. Cl.
*G06F 17/50*    (2006.01)
*G06F 17/10*    (2006.01)

(52) U.S. Cl.
CPC .......... *G06F 17/5009* (2013.01); *G06F 17/10* (2013.01)

(58) Field of Classification Search
None
See application file for complete search history.

(56) References Cited

U.S. PATENT DOCUMENTS

| | | | |
|---|---|---|---|
| 9,643,385 B1 | 5/2017 | Butler et al. | |
| 2007/0185695 A1* | 8/2007 | Neumann | G06F 19/704 703/2 |
| 2016/0133751 A1* | 5/2016 | Nomura | H01L 29/66969 345/520 |
| 2016/0232264 A1* | 8/2016 | Oh | G06F 17/5045 |

OTHER PUBLICATIONS

Mishra, Rohan. First Principles Study of Double Perovskites and Group III-V Compounds. The Ohio State University, 2012. 205 pages. (Year: 2012).*

(Continued)

*Primary Examiner* — Omar F Fernandez Rivas
*Assistant Examiner* — Robert S Brock
(74) *Attorney, Agent, or Firm* — Haynes Beffel & Wolfeld LLP

(57) ABSTRACT

Roughly described, a method is provided to approximate chemical potentials of elements in ternary and quaternary compound semiconductors, for example III-V semiconductors. In embodiments of the present invention, three, four, or more relationships are solved together to find approximated chemical potentials for each group III element and each group V element. The first relationship relates total energy of a defect-free system to the sum, over all of the group III and group V elements, of (a) provisional chemical potential for the respective element, times (b) number of atoms of the respective element within a supercell. The second relationship describes a stoichiometric balance relationship between total atomic density of all group III atoms and total atomic density of all group V atoms. The other relationship or relationships balance mole fraction ratio between group III atoms, or between group V atoms.

61 Claims, 6 Drawing Sheets

(56) References Cited

OTHER PUBLICATIONS

Kumar, Ashutosh. "Computation Assisted Study of Silicon Carbide: A Potential Candidate Material for Radiation Detector Devices." PhD diss., The Ohio State University, 2013. 210 pages. (Year: 2013).*

Mayer, J., C. Elsässer, and M. Fähnle. "Concentrations of Atomic Defects in B2-FexAl1-x. An Ab-Initio Study." physica status solidi (b) 191, No. 2 (1995): 283-298. (Year: 1995).*

Sen, Dipanjan, and Wolfgang Windl. "Ab-initio study of energetics of the Si (001)-LaAlO3 interface." Journal of Computational and Theoretical Nanoscience 4, No. 1 (2007): 57-64. (Year: 2007).*

Samolyuk, G. D., B. Újfalussy, and G. M. Stocks. "The distribution alloying elements in alnico 8 and 9 magnets: Site preference of ternary Ti, Fe, Co, and Ni additions in DO3 Fe3Al, Co3Al, and Ni3Al based intermetallic phases." Journal of Applied Physics 116, No. 17 (2014): 173908. 13 pages. (Year: 2014).*

Hagen, Michael, and Michael W. Finnis. "Point defects and chemical potentials in ordered alloys." Philosophical Magazine A 77, No. 2 (1998): 447-464. (Year: 1998).*

Jiang, Chao. "First-principles study of site occupancy of dilute 3d, 4d and 5d transition metal solutes in L10 TiAl." Acta materialia 56, No. 20 (2008): 6224-6231. (Year: 2008).*

Rogal, Jutta, Sergiy V. Divinski, Mike W. Finnis, Albert Glensk, Jörg Neugebauer, John H. Perepezko, Sergej Schuwalow, Marcel HF Sluiter, and Bo Sundman. "Perspectives on point defect thermodynamics." physica status solidi (b) 251, No. 1 (2014): 97-129. (Year: 2014).*

Torpo, L., et al. "Comprehensive ab initio study of properties of monovacancies and antisites in 4H-SiC." Journal of Physics: Condensed Matter 13.28 (2001): 6203-6231.

Zhang, S. B. et al. "Chemical potential dependence of defect formation energies in GaAs: Application to Ga self-diffusion." Physical review letters 67.17 (1991): 2339-2342.

Mishra, et al. "Native point defects in binary InP semiconductors." Journal of Materials Science 47.21 (2012): 7482-7497.

Energy of Formation—an Overview, Science Direct, https://www.sciencedirect.com/topics/earth-and-planetary-sciences/energy-of-formation, Mar. 11, 2015, 37 pages.

Denbigh, Kenneth, The Principles of Chemical Equilibrium, Cambridge University Press, London, Great Britain, 1957, 514 pages.

ECE 110 Course Notes—Energy, https://courses.engr.illinois.edu/ece110/sp2019/content/courseNotes/files/?energy, Mar. 20, 2015, 6 pages.

* cited by examiner

METHOD TO APPROXIMATE CHEMICAL POTENTIAL IN A TERNARY OR QUATERNARY SEMICONDUCTOR

BACKGROUND

The present technology relates to electronic design automation (EDA) tools, and modeling of new semiconductor materials for use in electronic devices.

As device dimensions shrink, device designers are turning to materials other than silicon, such as III-V semiconductor alloys. Silicon has been used for decades and is well-understood, but the behavior of these new materials is yet to be fully characterized.

Properties of materials can be calculated from ab initio, or first principles, calculations of electronic structures based on quantum physics theories. First principles models can be used to compute thermodynamic and transport properties of pure materials, defects and dopants. Results of first principles calculations are used to drive higher-level calculations, such as kinetic Monte Carlo and continuum calculations. From these, device properties are derived.

Performing first principles calculations is difficult and costly. First principles calculations can require in-depth understanding of quantum physics and related theories, and can take a person significant amount of time to understand the calculations. Also, it can require manual work to extract physical parameters from results of the first principles calculations. It is desirable to provide technologies that can optimize utilization of the computing resources.

An important quantity for modeling behavior of new materials is defect formation energy, and calculations of defect formation energy use chemical potential of the component species. It is not trivial to calculate chemical potential in binary compounds, however. The problem becomes still more complex when considering ternary and quaternary III-V compounds.

It is thus desirable to develop methods and tools to calculate chemical potentials and defect formation energies in ternary and quaternary III-V compounds.

SUMMARY

The technology disclosed herein relates to data processing systems and methods to approximate chemical potential.

A system for evaluating candidate material for fabrication of integrated circuits is described herein, the system comprising a memory and a processor coupled to the memory, the processor configured to approximate chemical potentials of a ternary, quaternary, or higher-order III-V semiconductor compound, wherein at least two group III elements are distributed among group III sites of the compound, or at least two group V elements are distributed among group V sites of the compound, or both. In aspects described herein, said approximation is achieved by solving a set of at least three relationships together to find approximated chemical potentials for each of the group III elements and each of the group V elements. The first of the at least three relationships relates (1) total energy of a defect-free system ($E_{TOTAL}$(ref)) to (2) the sum, over all of the group III and group V elements, of (a) provisional chemical potential for the respective element, times (b) number of atoms of the respective element within a supercell. The second of the at least three relationships describes a stoichiometric balance relationship between total atomic density of all group III atoms and total atomic density of all group V atoms within the supercell. The remaining ones of the at least three relationships each describe a member of the group consisting of (1) a mole fraction ratio balance relationship between group III atoms within the supercell, and (2) a mole fraction ratio balance relationship between group V atoms within the supercell.

In one aspect described herein, the compound is a ternary semiconductor ($A_xB_{1-x}C$) of species A, B and C, wherein either species A and B are group III elements and species C is a group V element, or species A and B are group V elements and species C is a group III element. During the solving step, the at least three relationships can be written as three equations solved together to find approximated chemical potentials $u_A$, $u_B$, and $u_C$, wherein the first of the three equations relates (1) ($E_{TOTAL}$(ref)) to (2) the sum, for species A, B, and C, of (a) provisional chemical potentials $u_A$, $u_B$, or $u_C$, respectively, times (b) the number of atoms of species A, B, or C, respectively, within the supercell. The second of three equations describes the stoichiometric balance relationship between total atomic density of all group III atoms and total atomic density of all group V atoms within the supercell. The third of the three equations describes a mole fraction ratio balance relationship between species A and B within the supercell.

In another aspect described herein, the compound is a quaternary III-V semiconductor of species A, B, C, and D, wherein A and B, or A and B and C, share either the group III or the group V site. During the solving step, the at least three relationships can be written as four equations solved together to find approximated chemical potentials $u_A$, $u_B$, $u_C$, and $u_D$. The first of the four equations relates (1) ($E_{TOTAL}$(ref)) to (2) the sum, for species A, B, C, and D of (a) provisional chemical potentials $u_A$, $u_B$, $u_C$, or $u_D$, respectively, times (b) the number of atoms of species A, B, C, or D, respectively, within the supercell. The second of four equations describes the stoichiometric balance relationship between total atomic density of all group III atoms and total atomic density of all group V atoms within the supercell. The third and the fourth of the four equations each describes a member of the group consisting of (1) a mole fraction ratio balance relationship between group III atoms or (2) a mole fraction ratio balance relationship between group V atoms within the supercell.

In yet another aspect, the compound is a quaternary semiconductor ($A_xB_{1-x}C_yD_{1-y}$) of species A, B, C, and D, wherein either species A and B are group III elements and species C and D are group V elements, or species A and B are group V elements and species C and D are group III elements. During the solving step, the at least three relationships can be written as four equations solved together to find approximated chemical potentials $u_A$, $u_B$, $u_C$, and $u_D$. The first of the four equations relates (1) ($E_{TOTAL}$(ref)) to (2) the sum, for species A, B, C, and D, of (a) provisional chemical potentials $u_A$, $u_B$, $u_C$, or $u_D$, respectively, times (b) the number of atoms of species A, B, C, or D, respectively, within the supercell. The second of four equations describes the stoichiometric balance relationship between total atomic density of all group III atoms and total atomic density of all group V atoms within the supercell. The third of the four equations describes a mole fraction ratio balance relationship between species A and B within the supercell. The fourth of the four equations describes a mole fraction ratio balance relationship between species C and D within the supercell.

In a related aspect, the compound is a quaternary semiconductor ($A_xB_yC_{1-x-y}D$) of species A, B, C, and D, wherein either species A, B, and C are group III elements and species D is a group V element, or species A, B, and C are group V elements and species D is a group III element. During the solving step, the at least three relationships can be written as four equations solved together to find approximated chemical potentials $u_A$, $u_B$, $u_C$, and $u_D$. The first of the four equations relates (1) ($E_{TOTAL}$(ref)) to (2) the sum, for species A, B, C, and D, of (a) provisional chemical potentials $u_A$, $u_B$, $u_C$, or $u_D$, respectively, times (b) the number of atoms of species A, B, C, or D, respectively, within the supercell. The second of four equations describes the stoichiometric balance relationship between total atomic density of all group III atoms and total atomic density of all group V atoms within the supercell. The third of the four equations describes a mole fraction ratio balance relationship between species A and B. The fourth of the four equations describes a mole fraction ratio balance relationship between species B and C.

A computer readable medium is described herein, having stored thereon in a non-transitory manner, a plurality of software code portions defining logic for approximating chemical potentials of a ternary, quaternary, or higher-order III-V semiconductor compound, wherein at least two group III elements are distributed among group III sites of the compound, or at least two group V elements are distributed among group V sites of the compound, or both. The approximation is achieved by solving a set of at least three relationships together to find approximated chemical potentials for each of the group III elements and each of the group V elements. The first of the at least three relationships relates (1) total energy of a defect-free system ($E_{TOTAL}$(ref)) to (2) the sum, over all of the group III and group V elements, of (a) provisional chemical potential for the respective element, times (b) number of atoms of the respective element within a supercell. The second of the at least three relationships describes a stoichiometric balance relationship between total atomic density of all group III atoms and total atomic density of all group V atoms within the supercell. The remaining ones of the at least three relationships each describe a member of the group consisting of (1) a mole fraction ratio balance relationship between group III atoms within the supercell, and (2) a mole fraction ratio balance relationship between group V atoms within the supercell.

A method is described herein for approximating chemical potentials of a ternary, quaternary, or higher-order III-V semiconductor compound, wherein at least two group III elements are distributed among group III sites of the compound, or at least two group V elements are distributed among group V sites of the compound, or both. The method comprises the step of solving a set of at least three relationships together to find approximated chemical potentials for each of the group III elements and each of the group V elements. The first of the at least three relationships relates (1) total energy of a defect-free system ($E_{TOTAL}$(ref)) to (2) the sum, over all of the group III and group V elements, of (a) provisional chemical potential for the respective element, times (b) number of atoms of the respective element within a supercell. The second of the at least three relationships describes a stoichiometric balance relationship between total atomic density of all group III atoms and total atomic density of all group V atoms within the supercell. The remaining ones of the at least three relationships each describe a member of the group consisting of (1) a mole fraction ratio balance relationship between group III atoms within the supercell, and (2) a mole fraction ratio balance relationship between group V atoms within the supercell.

DETAILED DESCRIPTION

Figure 1:
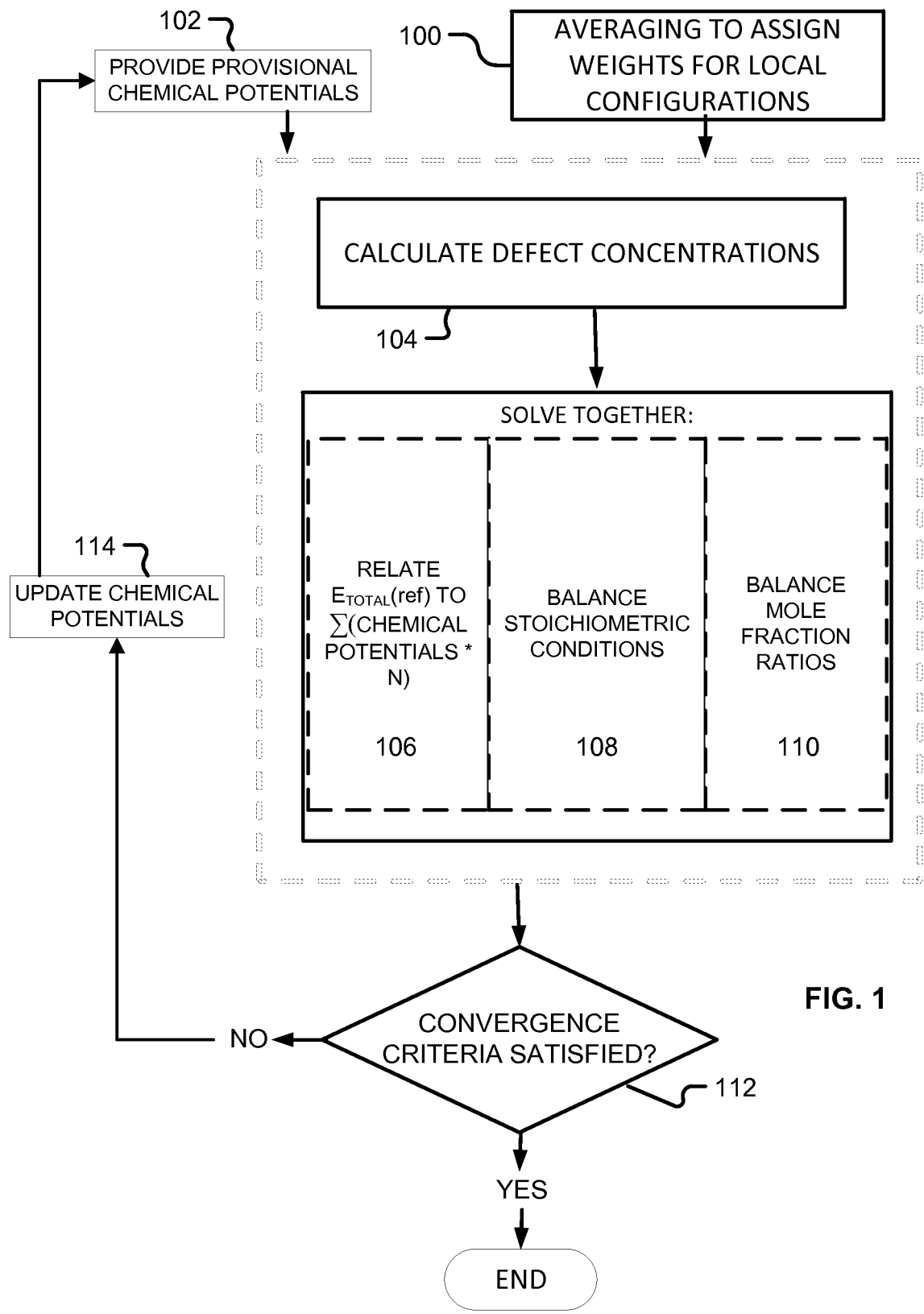
FIG. 1 illustrates a procedure to approximate chemical potentials in ternary, quaternary, and higher order III-V compounds according to embodiments of the present invention.

To model the properties of a material and its behavior in devices, it is necessary to understand the likely concentration of defects in the material. Defects are flaws in crystalline structure, and this discussion will consider three types of point defects: interstitials, vacancies, and antisites.

To understand the likely concentration of a particular defect type, it is necessary to find defect formation energy for that defect type. In a ternary semiconductor $A_{n1}B_{n2}C_{n3}$ of species A, B, and C, for example, formation energy $E_f(d)$ of a defect d can be written in the form:

$$E_f(d) = E_{TOTAL}(d) - E_{TOTAL}(\text{ref}) + n1'u_A + n2'u_B + n3'u_C \quad \text{Eq. 1}$$

$E_{TOTAL}$(ref) is the total energy of a reference system having no defects, while $E_{TOTAL}$(d) is the total energy of a system having a defect d. In Eq. 1, $u_A$, $u_B$, and $u_C$ are the chemical potentials of species A, B, and C; and n1', n2', and n3' are differences in number of atoms of species A, B, and C, respectively, between the reference structure and the structure with the defect.

Regarding scope of calculation, in embodiments of the present invention, calculation is performed across a supercell which may be of any practical size, where a larger supercell may call for more computational power and/or time. It may be convenient for a supercell size to be the cube of an integer, and thus a supercell may include, for example, 64, 216, 512, 1000, or 1728 atomic sites, or more or fewer. For a III-V compound, with a group III site and group V site, either or both of which may be shared, a supercell of 64 atomic sites will include 32 formula units for a formulation like $A_xB_{1-x}C$, $A_xB_yC_{1-x-y}D$, or $A_xB_{1-x}C_yD_{1-y}$. For example, for $A_xB_{1-x}C$, if x=0.5, a supercell of 64 will include 16 atoms of species A, 16 atoms of species B, and 32 atoms of species C. When this discussion refers to the number of something, such as the number of atoms or the number of formula units, this will be understood to refer to the number of atoms or formula units within the scope of calculation, which will be called a supercell.

It will be appreciated that while the equations set forth herein describe physical relationships, such equations could be written in many different forms and still describe the same physical relationships. Thus in a particular embodiment of the invention for which the equations are written in a different form, those equations can still be re-written in the form described herein, because they still describe the same physical relationships. As used herein, a particular equation or group of equations "can be written" or "can be re-written" in a form set forth herein if and only if the particular equation or equations are mathematically equivalent to the equation or equations in the form set forth herein.

The total energy of the reference system can be written in the form:

$$E_{TOTAL}(\text{ref}) = n1 u_A + n2 u_B + n3 u_C \qquad \text{Eq. 2}$$

where n1, n2, and n3 are the number of atoms of species A, B, and C, respectively.

The total energies $E_{TOTAL}(\text{ref})$ and $E_{TOTAL}(\text{d})$ can be calculated using ab initio software, such as VASP and QuantumESPRESSO. Chemical potentials $u_A$, $u_B$, and $u_C$, however, are not simple to calculate.

An existing method to calculate defect formation energy in a binary III-V semiconductor uses the chemical potentials of the elemental solids. For example, to calculate chemical potentials of Ga and As in the III-V compound GaAs, this method uses the chemical potentials of Ga in elemental Ga and of As in elemental As. (See Zhang et al., "Chemical Potential Dependence of Defect Formation Energies in GaAs: Application to Ga Self-Diffusion," Physical Review Letters, vol. 67 #17, 21 Oct. 1991, incorporated by reference herein.) But thermodynamics dictates that the chemical potential of any individual species in compound is different from that of species in the elemental solid.

It is also known to average chemical potentials of the elemental solids by a heat of formation method, as described by Torpo et al., "Comprehensive ab initio study of properties of monovacancies and antisites in 4H-SiC," 2001 *J. Phys.: Condens. Matter* 13 6203, incorporated by reference herein. This method, though, can result in non-stoichiometric situations.

Other existing methods to find chemical potential for components of binary III-V semiconductors may consider only one defect type at a time, rather than all possible point defects, and thus fail to address the problem in a comprehensive manner. The situation becomes still more complex when considering ternary and quaternary compounds, composed of three or four species, in which two or three elements share either the group III or group V sites, or both.

This discussion will refer mostly to III-V semiconductors, but those skilled in the art will recognize that the methods of the present invention could also be applied to different alloys, such as II-VI semiconductors. It is conventional in a chemical formula for a III-V (or II-VI) semiconductor for the group III element(s) to come first and the group V element(s) to come second. For ease of explanation, though, in the discussion that follows, in formulas such as $A_xB_{1-x}C$, $A_xB_{1-x}C_yD_{y-1}$, or $A_xB_yC_{1-x-y}D$, for example, this conventional order may or may not be employed; i.e. in a particular formula, the earlier-named species, A, B, and/or C, may be type III while the later-named species, B, C, and/or D, may be type V; or, alternatively, the earlier-named species, A, B, and/or C, may be type V while the later-named species, B, C, and/or D, may be type III.

The methods of the present invention provide a unified, comprehensive approach for calculating chemical potential of component of ternary and quaternary III-V semiconductors in the compound form, considering multiple defect types while maintaining both the stoichiometric balance between the group III and group V atoms and the mole fraction balance between atoms sharing a lattice site, all in a way that minimizes calculation.

An overview of an embodiment appears in the flow chart of FIG. 1. Averaging is performed to assigned weights for local configurations (step 100), and provisional chemical potentials, which, to start calculation, may be best guess estimates, are provided (step 102). Defect concentrations are calculated (step 104), and then three (or more) equations are solved together. The first (106) relates the total energy of a reference system, $E_{TOTAL}(\text{ref})$, to the sum of the chemical potentials of each component species times the number of atoms of that species. The second (108) maintains stoichiometric balance between group III and group V atoms. The third (110), which, as will be seen, may be more than one equation, balances mole fraction ratios between species sharing a group III or group V site. Convergence criteria are applied (112) to the resulting chemical potentials for the component species. If the convergence criteria are satisfied, calculation is done. If they are not, the chemical potentials are updated (114) to provide new provisional chemical potentials (102), and iteration continues.

For simplicity the discussion will focus in detail on the ternary case $A_xB_{1-x}C$ first, and the method will be extended to quaternary cases afterward.

Ternary Compound $A_xB_{1-x}C$: Before Iteration

In, for example, a III-V compound like $In_xGa_{1-x}As$, a variety of native defect types are possible (native defects meaning defects involving only the component species In, Ga, and As). There may be an interstitial of each type, an extra In, Ga, or As atom appearing between lattice sites. There may be an empty lattice site, an In, Ga, or As vacancy. There may also be antisite defects, in which a group III atom (In or Ga) appears in the place of As, the group V atom, or vice versa. To generalize, then, in a ternary compound $A_xB_{1-x}C$, there are three possible interstitials for species A, B, and C, designated $A_i$, $B_i$, and $C_i$. There are three possible vacancies, designated $V_A$, $V_B$, and $V_C$. There are four possible antisites, $A_C$, $C_A$, $B_C$, $C_B$. (Note that, in this example, compounds A and B share a lattice site, and thus substitutions between them are not considered antisite defects.) So for a ternary compound $A_xB_{1-x}C$, there are ten possible defect types.

Formation energy $E_f(d)$ for a defect depends on its local configuration, the neighborhood in which it appears. In a binary compound like GaAs, the neighborhood of any Ga or As atom, respectively, is always the same. Every As atom has four Ga nearest neighbors and vice versa. Thus in a binary III-V compound, the formation energy of a particular defect, such as $V_{Ga}$, will not vary depending on its location.

For a ternary or quaternary system, however, there are multiple possible local configurations, and the total energy $E_{TOTAL}(\text{d})$ of a system with defect d is different depending on the location, and the local configuration, of the defect.

For example, in a ternary compound such as $In_xG_{1-x}As$, In and Ga atoms share the group III site. Any As atom (a group V atom) is bonded to four group III atoms, and so its immediate neighborhood may be any of several possible configurations: for example four In and no Ga, three In and one Ga, two In and two Ga, one In and three Ga, or four Ga and no In.

The calculations of certain embodiments of the present invention take all of these variations into account. But all of the configurations are not equally probable, so the method uses averaging to assign a weight to each local configuration corresponding to its probability. Though other forms of averaging may be used, Boltzman averaging has been found to provide the best results.

In some embodiments, for a defect d, a set of supercells is created, one for each site the defect may occupy. For example, for compound $A_xB_{1-x}C$ using a supercell of size 64, if the defect d is a C vacancy $V_C$, it may occur at any of 32 group V sites, so 32 supercells are created, each of these supercells having the defect in a different location. Using ab initio tools, creation energy is calculated for each of the 32 supercells. The weight Wj for a configuration j may be modeled using an equation which can be written in the form:

$$W_j = \exp(-E_{CR}(d)_j/k_BT)/\Sigma_i(\exp(-E_{CR}(d)_i/k_BT)) \quad \text{Eq. 3}$$

where creation energy $E_{CR}(d)_j$ can be written in the form:

$$E_{CR}(d)_j = E_{TOTAL}(d)_j - E_{TOTAL}(\text{ref}) \quad \text{Eq. 4}$$

Ab initio calculations are computationally intensive. It may be known, for a given defect type, that creation energy depends primarily on the nearest neighbors, or second nearest neighbors, of the defect. In some embodiments this fact may be used to reduce the number of ab initio runs. In the case, for example, of ternary compound $In_xGa_{1-x}As$, as described earlier, As vacancy $V_{As}$ may have any of five possible nearest neighbor configurations (four In and no Ga through four Ga and no In.) It may be assumed that any supercell having a $V_{As}$ defect which occurs in a local configuration of, say, three In and one Ga has nearly identical creation energy regardless of its location in the supercell. Using this assumption, the ab initio tool may be run only once per configuration, five times in this example. It can be found how many times each configuration will occur in the supercell. Suppose the compound is $In_{0.5}Ga_{0.5}As$. The number of each configuration among the 32 group V sites in a 64-atom supercell can be counted as follows:

| | |
|---|---|
| 4 In 0 Ga | 3 occurrences |
| 3 In 1 Ga | 8 occurrences |
| 2 In 2 Ga | 10 occurrences |
| 1 In 3 Ga | 9 occurrence |
| 0 In 4 Ga | 2 occurrences |

Put another way, for the eight locations among the 32 supercells in which the $V_{As}$ defect occurs in a local configuration having 3 In and 1 Ga, the ab initio tool is run for only one of them, rather than for all eight. Using Nj, then, eq. 3 can be rewritten as eq. 3':

$$W_j = N_j \exp(-E_{CR}(d)_j/k_BT)/\Sigma_i(N_i \exp(-E_{CR}(d)_i/k_BT)) \quad \text{Eq. 3'}$$

where $N_j$ is the number of occurrences of defect d at configuration j in the set of supercells, e.g. $N_j=3$ for four In and no Ga for the defect $V_{As}$. It will be seen that $N_j$ equals M times the probability that defect d occurs at configuration j and, further, that $N_i$ equals M times the probability that defect d occurs at configuration i.

Once the weights Wj have been calculated, calculation of chemical potentials may begin.

Ternary Compound $A_xB_{1-x}C$: Approximation of Chemical Potentials

For the ternary case, for a III-V semiconductor $A_xB_{1-x}C$ of species A, B and C, an embodiment of the invention finds approximated chemical potentials $u_A$, $u_B$, and $u_C$ by solving three equations together.

The first equation, for a ternary species $A_xB_{1-x}C$, relates total energy of a defect-free system ($E_{TOTAL}(\text{ref})$) to the sum of the provisional chemical potentials $u_A$, $u_B$, and $u_C$, each times the number of atoms of that species in the supercell, and can be written in the form:

$$E_{TOTAL}(\text{ref}) = N(xu_A + (1-x)u_B + u_C) \quad \text{Eq. 5}$$

where N is the number of formula units in the supercell used for calculation.

In some embodiments, solving will involve iteration. As used herein, "iteration" comprises a plurality of "passes", including a first pass and subsequent passes. Actual chemical potentials $u_A$, $u_B$, and $u_C$, of course, are unknown, so to begin calculation, for the first pass, the method uses provisional chemical potentials, $u_A$, $u_B$, and $u_C$, which may be, for example, best-guess estimates provided by the user or by some prior algorithm. In some embodiments, provisional chemical potential for each species may be the total energy of a defect-free system divided by the number of atoms in the supercell.

For the next two equations, consider that the existence of a defect changes the number of atoms in the local neighborhood in which it occurs. For example, when a Ga interstitial occurs, there is, locally, an extra Ga atom, while an As vacancy means a missing As atom. Similarly, an antisite defect such as $As_{In}$ means an extra As replacing an In. If we assume, for the volume over which calculation takes place, that the ratio of group III to group V atoms remains stoichiometric, and the mole fraction is maintained, then we can assume that these disturbances balance: A missing In atom in one location is balanced by an extra In atom in another location, and so on. The second and third equations of the present embodiment assure this.

The second of the three equations balances the atomic densities of the group III atoms and the group V atoms and can be written in the form:

$$\frac{N}{Vol} + (c(A_i) + c(A_C) - c(V_A) - c(C_A)) + \\ (c(B_i) + c(B_C) - c(V_B) - c(C_B)) = \\ \frac{N}{Vol} + (c(C_i) - c(V_C) + c(C_A) - c(A_C) + c(C_B) - c(B_C)) \quad \text{Eq. 6}$$

where N is the number of formula units in the supercell and Vol is the volume of the supercell.

The third of the three equations balances the atomic densities of atoms sharing either the group III or group V sites, so for compound $A_xB_{1-x}C$ can be written:

$$(1-x)\left(\frac{N_A}{Vol} + c(A_i) + c(A_C) - c(V_A) - c(C_A)\right) = \\ x\left(\frac{N_B}{Vol} + c(B_i) + c(B_C) - c(V_B) - c(C_B)\right) \quad \text{Eq. 7}$$

where $N_A$ and $N_B$ are the number of atoms of species A and B, respectively, in the supercell, Vol is the volume of the supercell, and c(d) is the concentration of a defect type, as will now be explained.

The local changes in the number of atoms due to the different defect types need to balance out, but not all defect types are equally probable. Those with higher formation energies occur at a lower concentration, and vice versa. The second and third equations thus require calculation of the concentration c(d) of each defect type d. Concentration c(d) is calculated with an equation that can be written in the form:

$$c(d) = x_d c_0 \exp\left(\frac{-E_f(d)}{k_B T}\right) \quad \text{Eq. 8}$$

Where $c_0$ is the prefactor proportional to lattice site density, and $x_d$ is the mole fraction of the constituent element associated with defect d. For antisite defect $A_C$, for example, $x_d$ is given by $x_A \cdot x_C$.

To calculate concentration c(d) of a particular defect type d, then, it is necessary to know its formation energy $E_f(d)$.

Referring to eqs. 1 and 2, it will be seen that the formation energy $E_f(d)_j$ of defect d at configuration j can be written in the form:

$$E_f(d)_j = E_{CR}(d)_j + n1' u_A + n2' u_B + n3' u_C \qquad \text{Eq. 9}$$

For chemical potential $u_A$, $u_B$ and $u_C$, the provisional chemical potentials provided by the user for eq. 9 are used.

Then, once formation energy $E_f(d)_j$ for each configuration j has been calculated, the Boltzmann averages calculated earlier are used in eq. 10 to find a weighted sum. This equation can be written in the form:

$$E_f(d) = \Sigma_j W_j E_f(d)_j \qquad \text{Eq. 10}$$

To give an example, in the case of $In_xGa_{1-x}As$, we have ten defect types. We pick one, say $V_{As}$, an As vacancy. This $V_{As}$ defect will have five possible nearest neighbor configurations: four In and no Ga, three In and one Ga, two In and two Ga, one In and three Ga, and four In and no Ga. We use eq. 9 to calculate the formation energies for $V_{As}$ in each of the possible local configurations for $In_xGa_{1-x}As$. Calculation for all five nearest-neighbor calculations will be performed using eq. 9, yielding five different formation energies for $V_{As}$, depending on the local configuration in which the defect occurs. Those five configurations are not equally probable, though, so using eq. 10 we sum them according to their relative probability using the weight $W_j$ calculated by the Boltzmann averaging done earlier, and the result is a formation energy $E_f(d)$ for $V_{As}$. This formation energy is used in eq. 8 to find the concentration $c(V_{As})$ of As vacancies in a volume. The same set of calculations is then done for all of the other nine defect types for a ternary III-V system to find all the terms required by eqs. 9 and 10.

Once a concentration c(d) has been calculated for each defect type d, we can populate eqs. 6 and 7. Now equations 5, 6, and 7 can be solved together.

This solving step will yield calculated values $u_A$, $u_B$, and $u_C$ for chemical potential for each of species A, B, and C. Solving can be done using known numerical methods (such as iterative numerical methods), and will be considered solved when convergence criteria are satisfied.

If the convergence criteria are not satisfied, iteration continues, again solving eqs. 5, 6 and 7 together. For subsequent passes, after the first, provisional chemical potentials are derived from the previous calculation, as will be appreciated by those skilled in the art. These new provisional chemical potentials will be used in eq. 5. Similarly, to find the terms for concentration c(d) for eqs. 6 and 7, for iterative passes after the first, for each defect type d we use the new provisional chemical potentials $u_A$, $u_B$, and $u_C$ in eq. 9 to calculate new formation energies $E_f(d)_j$ for each local configuration j, then use eq. 10 to sum these weighted averages to find a new formation energy $E_f(d)$ for that defect type d. This is done for each of the ten defect types. These formation energies $E_f(d)$ are then used in eq. 8 to find the new concentration c(d) for each defect type d. Now eqs. 5, 6, and 7 can be solved again.

Note that the Boltzmann averaging used to assign relative weights $W_j$ for each local configuration j (see eqs. 3 and 3') relies on creation energy $E_{CR}$ (see eq. 4), not on defect formation energy $E_f(d)$ or chemical potentials $u_A$, $u_B$, and $u_C$, and thus there is no need to update the weights $W_j$ with each iterative pass.

When the convergence criteria are satisfied, iteration is finished. Any known method of solving a system of non-linear equations by iteration may be used to solve the three (or more) equations (e.g. eqs. 5, 6, and 7 or eqs. 11, 12, 13, and 14) to approximate chemical potential, where iteration is complete when convergence criteria are satisfied. A suitable approach would be to use the Newton-Raphson method, using a Jacobian matrix, for example a 3×3 matrix, to solve the equations. Also, any suitable convergence criteria can be used. In one embodiment, when the difference between successive passes falls below a predetermined threshold, iteration is finished. Other iterative methods, either presently known or future-developed, may be used in various embodiments. Similarly, other convergence criteria either presently known or future-developed, may be used in various embodiments.

The calculated chemical potentials from the final pass of iteration, or chemical potentials derived from them, are the approximated chemical potentials resulting from the above-described embodiment of the present invention.

These approximated chemical potentials can then be used to calculate defect formation energies. For a defect type, the approximated chemical potentials $u_A$, $u_B$, and $u_C$ are used in eq. 9 to find defect formation energy $E_f(d)_j$ for each local configuration. Then the formation energy $E_f(d)$ for defect type d is found by calculating a weighted sum using eq. 10.

Figure 2:
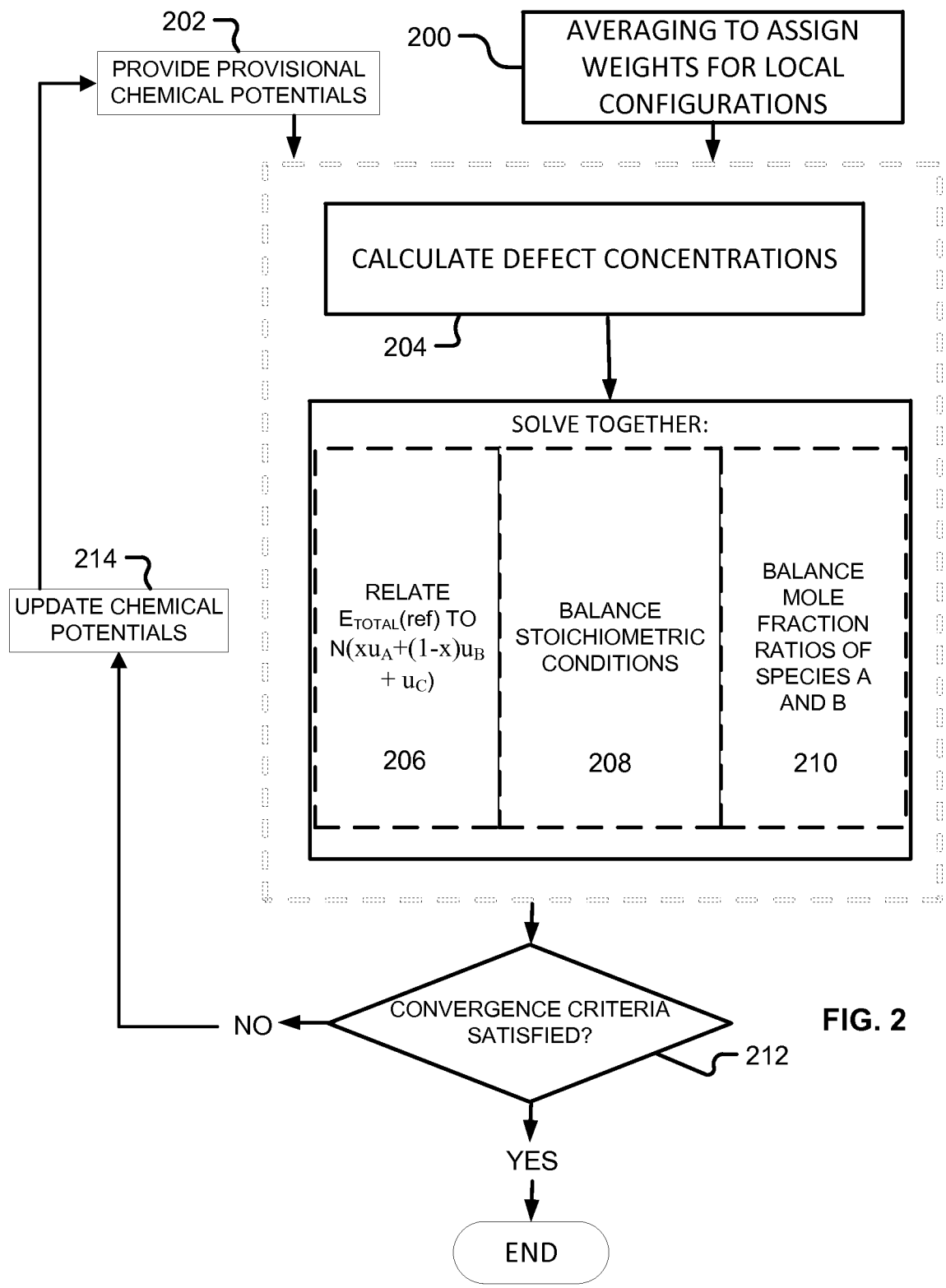
FIG. 2 illustrates a procedure to approximate chemical potentials of species A, B, and C in a ternary compound of the form $A_xB_{1-x}C$ according to embodiments of the present invention.

To summarize, referring to FIG. 2, before iteration, averaging (200) is performed to assign weights. Using provisional chemical potentials (202), defect concentrations are calculated (204), then equations 5, 6, and 7 are solved together (206, 208, 210). If convergence criteria are satisfied (212), approximation is finished. If not, the chemical potentials are updated (214) to provide new provisional chemical potentials (202) for the next pass of iteration.

Moving on to quaternary semiconductors, two cases, $A_xB_{1-x}C_yD_{1-y}$ and $A_xB_yC_{1-x-y}D$ will be considered.

Quaternary Compound $A_xB_{1-x}C_yD_{1-y}$: Before Iteration

An example of a quaternary compound semiconductor of this type would be, for example, $In_{0.25}Ga_{0.75}As_{0.5}P_{0.5}$, with In and Ga sharing the group III site and As and P sharing the group V site. In a quaternary compound $A_xB_{1-x}C_yD_{1-y}$, there are four possible interstitials for species A, B, C, and D, designated $A_i$, $B_i$, $C_i$, $D_i$. There are four possible vacancies, designated $V_A$, $V_B$, $V_C$, and $V_D$. To form antisite defects, either of the group III (or group V) species can substitute for either of the group V (or group III) species, so there are eight possible native antisite defects, $A_C$, $A_D$, $B_C$, $B_D$, $C_A$, $C_B$, $D_A$ and $D_B$. Since species A and B share a lattice site, substitutions between them are not considered antisite defects; the same holds for species C and D. So for a quaternary compound $A_xB_{1-x}C_yD_{1-y}$, there are sixteen possible defect types.

As described earlier, in a binary III-V semiconductor compound, the local configuration (and thus the formation energy) of any defect d is identical regardless of its location. The ternary case is more complex; the example was given of a ternary compound $In_xGa_{1-x}As$, in which any As atom may have five different nearest neighborhoods, ranging from all In to all Ga.

It will be understood that the quaternary case $A_xB_{1-x}C_yD_{1-y}$ is more complex still, with many more local configurations possible. Boltzmann averaging is performed, and the weight Wj for a configuration j may be modeled using eq. 3, or eq. 3', provided above.

The calculated weights Wj for each configuration are used in the calculation of chemical potentials.

Quaternary Compound $A_xB_{1-x}C_yD_{1-y}$: Approximation of Chemical Potentials For a III-V semiconductor $A_xB_{1-x}C_yD_{1-y}$ of species A, B, C, and D, an embodiment of the present invention finds approximated chemical potentials $u_A$, $u_B$, $u_C$, and $u_D$ by solving four equations together.

The first equation, for a quaternary species $A_xB_{1-x}C_yD_{1-y}$, relates total energy of a defect-free system ($E_{TOTAL}$(ref)) to the sum of the provisional chemical potentials $u_A$, $u_B$, $u_C$, and $u_D$, each times the number of atoms of that species. This equation is analogous to eq. 5 of the ternary case and can be written in the form:

$$E_{TOTAL}(\text{ref}) = N(xu_A + (1-x)u_B + yu_C + (1-y)u_D) \quad \text{Eq. 11}$$

where N is the number of formula units in the supercell used for calculation.

Actual chemical potentials $u_A$, $u_B$, $u_C$, and $u_D$, of course, are unknown, so to begin calculation, for the first pass, the method uses provisional chemical potentials, which may be, for example, best-guess estimates provided by the user or by some prior algorithm.

The second of the four equations balances the atomic densities of the group III atoms and the group V atoms using an equation analogous to eq. 6 of the ternary case which can be written in the form:

$$\frac{N}{Vol} + (c(A_i) - c(V_A) + c(A_C) - c(C_A) + c(A_D) - c(D_A)) + \quad \text{Eq. 12}$$
$$(c(B_i) - c(V_B) + c(B_C) - c(C_B) + c(B_D) - c(D_B)) =$$
$$\frac{N}{Vol} + (c(C_i) - c(V_C) + c(C_A) - c(A_C) + c(C_B) - c(B_C)) +$$
$$(c(D_i) - c(V_D) + c(D_A) - c(A_D) + c(D_B) - c(B_D))$$

where N is the number of formula units in the supercell and Vol is the volume of the supercell.

The third and fourth of the four equations balance the atomic densities of atoms sharing either the group III or group V sites, assuring that mole fraction ratios are maintained, so for compound $A_xB_{1-x}C_yD_{1-y}$ the third equation balances species A and B and can be written in the form:

$$(1-x)\left(\frac{N_A}{Vol} + c(A_i) - c(V_A) + c(A_C) - c(C_A) + c(A_D) - c(D_A)\right) = \quad \text{Eq. 13}$$
$$x\left(\frac{N_B}{Vol} + c(B_i) - c(V_B) + c(B_C) - c(C_B) + c(B_D) - c(D_B)\right)$$

where $N_A$ and $N_B$ are the number of atoms of species A and B, respectively, in the supercell, Vol is the volume of the structure, and c(d) is the concentration of a defect type.

The fourth equation balances the mole fraction ratios of species C and D and can be written in the form:

$$(1-y)\left(\frac{N_C}{Vol} + c(C_i) - c(V_C) + c(C_A) - c(A_C) + c(C_B) - c(B_C)\right) = \quad \text{Eq. 14}$$
$$y\left(\frac{N_D}{Vol} + c(D_i) - c(V_D) + c(D_A) - c(A_D) + c(D_B) - c(B_D)\right)$$

where $N_C$ and $N_D$ are the number of atoms of species C and D, respectively, in the supercell, Vol is the volume of the structure, and c(d) is the concentration of a defect type. It will be understood that eqs. 13 and 14 together are analogous to eq. 7 of the ternary case.

As in the ternary case, concentrations c(d) for a defect d are calculated using eq. 8 provided earlier. It will be recalled that eq. 8 requires formation energy $E_f(d)$ for each defect type d, which is calculated using eqs. 9 and 10 above. Note that for the quaternary case, eq. 9 has an extra term for the chemical potential of species D. The modified equation will be called eq. 9', and the formation energy $E_f(d)_j$ of defect d at configuration j can be written in the form:

$$E_f(d)_j = E_{CR}(d)_j + n1'u_A + n2'u_B + n3'u_C + n4'u_D \quad \text{Eq. 9'}$$

For chemical potential $u_A$, $u_B$, $u_C$, and $u_D$, we use the provisional chemical potentials provided by the user for eq. 11. Eq. 10 above is then used to find a weighted sum of formation energy $E_f(d)_j$ for each local configuration j, yielding formation energy $E_f(d)$ for defect d. Once defect formation energy has been found for all sixteen defect types for compound $A_xB_{1-x}C_yD_{1-y}$, concentrations c(d) can be calculated using eq. 3 or 3'. Once concentrations c(d) are calculated, eqs. 12, 13, and 14 can be populated. All four equations 11, 12, 13, and 14 are solved together. As in the ternary case, the calculation results in calculated chemical potentials $u_A$, $u_B$, $u_C$, and $u_D$, which are subjected to convergence criteria.

Iteration continues until the convergence criteria are satisfied. As in the ternary case, for iterative passes after the first, the calculated chemical potentials $u_A$, $u_B$, $u_C$, and $u_D$ from the previous pass, or chemical potentials derived from them, become the provisional chemical potentials $u_A$, $u_B$, $u_C$, and $u_D$ for the next pass.

To find the terms for concentration c(d) for eqs. 12, 13 and 14, for passes after the first, for each defect type d we use the new provisional chemical potentials $u_A$, $u_B$, $u_C$, and $u_D$ in eq. 9' to calculate new formation energies $E_f(d)_j$ for each local configuration j, then use eq. 10 to sum these weighted averages to find a new formation energy $E_f(d)$ for that defect type d. This is done for each of the sixteen defect types. These formation energies $E_f(d)$ are then used in eq. 8 to find the new concentration c(d) for each defect type d. Now the four eqs. 11, 12, 13, and 14 can be solved again.

When the calculated chemical potentials from the solving of eqs. 11, 12, 13, and 14 satisfy the convergence criteria, iteration is finished. The Newton-Raphson method may be used, this time using a 4×4 Jacobian matrix. The calculated chemical potentials from the final pass of iteration, or chemical potentials derived from them, are the approximated chemical potentials resulting from the above-described embodiment of the present invention.

These approximated chemical potentials can be used to calculate defect formation energies. For a defect type, the approximated chemical potentials $u_A$, $u_B$, $u_C$, and $u_D$ are used in eq. 9 to find defect formation energy $E_f(d)_j$ for each local configuration. Then the formation energy $E_f(d)$ for defect type d is found by calculating a weighted sum using eq. 10.

Figure 3:
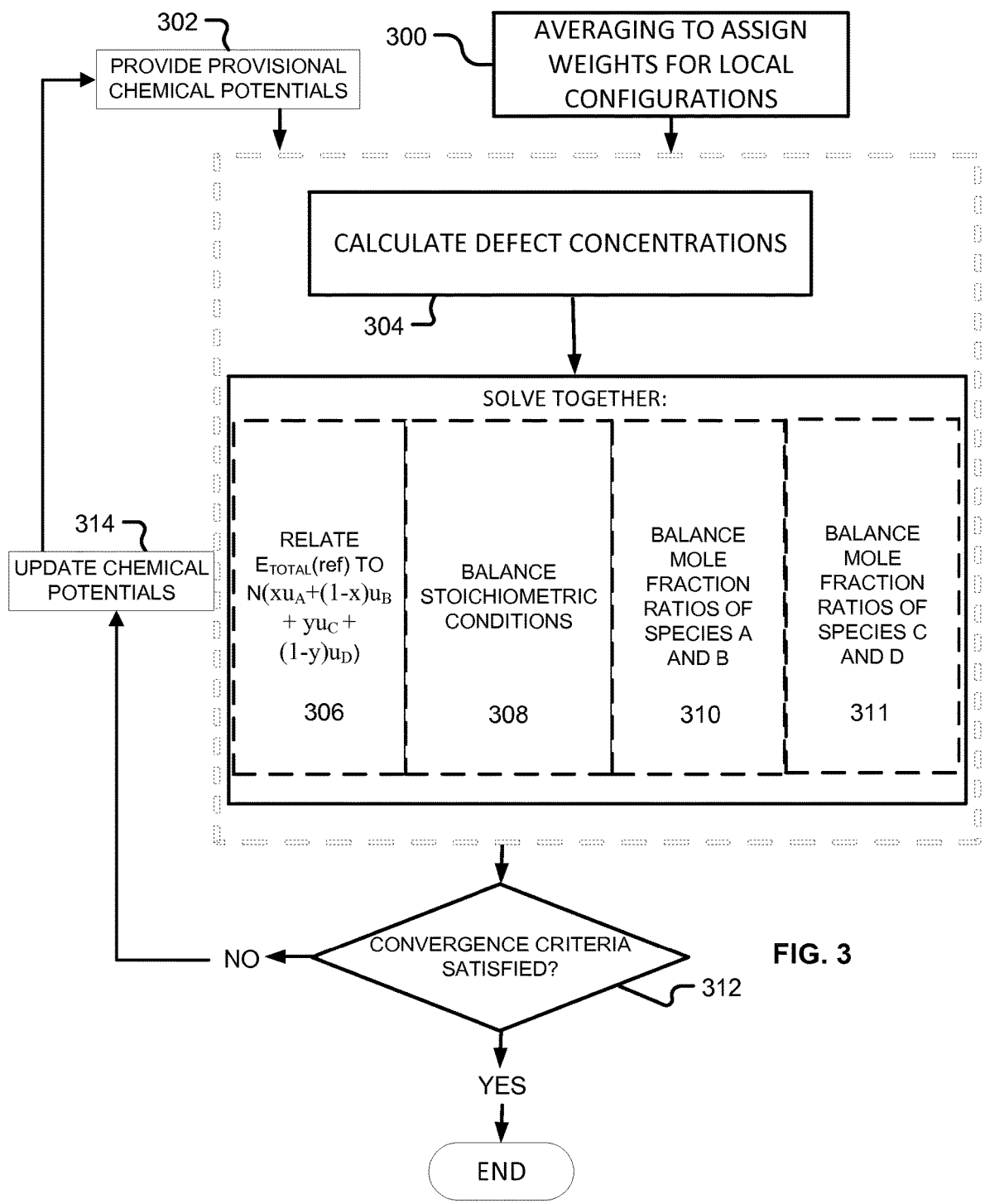
FIG. 3 illustrates a procedure to approximate chemical potentials of species A, B, C, and D in a quaternary compound of the form $A_xB_{1-x}C_yD_{1-y}$ according to embodiments of the present invention.

To summarize, referring to FIG. 3, before iteration, averaging (300) is performed to assign weights. Using provisional chemical potentials (302), defect concentrations are calculated (304), then equations 11, 12, 13 and 14 are solved together (306, 308, 310, 311). If convergence criteria are satisfied (312), approximation is finished. If not, the chemical potentials are updated (314) to provide new provisional chemical potentials (302) for the next pass.

A second quaternary case, $A_xB_yC_{1-x-y}D$, will now be considered.

Quaternary Compound $A_xB_yC_{1-y-x}D$: Before Iteration

An example of a quaternary compound semiconductor of this type would be, for example, $In_{0.25}Ga_{0.5}Al_{0.25}As$, with Al, In, and Ga sharing the group III site and As occupying the group V site. In a quaternary compound $A_xB_yC_{1-x-y}D$, there are four possible interstitials for species A, B, C, and D, designated $A_i$, $B_i$, $C_i$, $D_i$. There are four possible vacancies, designated $V_A$, $V_B$, $V_C$, and $V_D$. To form antisite defects, any of the group III (or group V) species can substitute for the single group V (or group III) species, so there are six possible native antisite defects, $A_D$, $D_A$, $B_D$, $D_B$, $C_D$, and $D_C$. Thus for a quaternary compound $A_xB_yC_{1-x-y}D$, there are fourteen possible defect types.

As in the cases described earlier, Boltzmann averaging is performed, and the weight Wj for a configuration j may be modeled using eq. 3, or eq. 3', provided above.

Once the weights Wj for each configuration have been calculated, calculation of chemical potentials may begin.
Quaternary Compound $A_xB_yC_{1-y-x}D$: Approximation of Chemical Potentials As in the other quaternary case, for a III-V semiconductor $A_xB_yC_{1-x-y}D$ of species A, B, C, and D, an embodiment of the present invention finds approximated chemical potentials $u_A$, $u_B$, $u_C$, and $u_D$ by solving four equations together.

The first equation, for a quaternary species $A_xB_yC_{1-x-y}D$, relates total energy of a defect-free system ($E_{TOTAL}$(ref)) to the sum of the provisional chemical potentials $u_A$, $u_B$, $u_C$, and $u_D$, each times the number of atoms of that species. This equation is analogous to eq. 5 of the ternary case and eq. 11 of the previously discussed quaternary case and can be written in the form:

$$E_{TOTAL}(\text{ref}) = N(xu_A + yu_B + (1-x-y)u_C + u_D) \qquad \text{Eq. 15}$$

where N is the number of formula units in the supercell used for calculation.

As in the earlier examples, provisional chemical potentials $u_A$, $u_B$, $u_C$, and $u_D$, which may be best-guess estimates or may be provided by some prior algorithm, are used in place of the actual chemical potentials, which are unknown.

The second of the four equations balances the atomic densities of the group III atoms and the group V atoms using an equation analogous to eq. 6 of the ternary case and eq. 12 of the earlier quaternary case which can be written in the form:

$$\frac{N}{Vol} + c(A_i) + c(A_D) - c(V_A) - c(D_A) + c(B_i) + c(B_D) - c(V_B) - \qquad \text{Eq. 16}$$
$$c(D_B) + c(C_i) + c(C_D) - c(V_C) - c(D_C) = \frac{N}{Vol} + c(D_i) -$$
$$c(V_D) + c(D_A) - c(A_D) + c(D_B) - c(B_D) + c(D_C) - c(C_D)$$

where N is the number of formula units in the supercell, Vol is the volume of the structure, and c(d) is the concentration of a defect type The third and fourth of the four equations balance the atomic densities of atoms sharing a group III or group V site, assuring that mole fraction ratios are maintained, so for compound $A_xB_yC_{1-x-y}D$ the third equation balances mole fraction ratios of species A and B and can be written in the form:

$$y\left(\frac{N_A}{Vol} + c(A_i) - c(V_A) + c(A_D) - c(D_A)\right) = \qquad \text{Eq. 17}$$
$$x\left(\frac{N_B}{Vol} + c(B_i) - c(V_B) + c(B_D) - c(D_B)\right)$$

where $N_A$ and $N_B$ are the number of atoms of species A and B, respectively, in the supercell, Vol is the volume of the structure, and c(d) is the concentration of a defect type.

The fourth equation balances mole fraction ratios of species B and C and can be written in the form:

$$(1-x-y)\left(\frac{N_B}{Vol} + c(B_i) - c(V_B) + c(B_D) - c(D_B)\right) = \qquad \text{Eq. 18}$$
$$y\left(\frac{N_C}{Vol} + c(C_i) - c(V_C) + c(C_D) - c(D_C)\right)$$

where $N_B$ and $N_C$ are the number of atoms of species B and C, respectively, in the supercell, Vol is the volume of the structure, and c(d) is the concentration of a defect type. It will be understood that eqs. 17 and 18 are analogous to eqs. 13 and 14 of the prior quaternary case, and to eq. 7 of the ternary case.

As in the ternary case, concentrations c(d) for a defect d are calculated using eq. 8 provided earlier. It will be recalled that eq. 8 requires formation energy $E_f(d)$ for each defect type d, which is calculated using eqs. 9 and 10 above.

For chemical potential $u_A$, $u_B$, $u_C$, and $u_D$, we use the provisional chemical potentials provided by the user for eq. 15. Eq. 10 above is then used to find a weighted sum of formation energy $E_f(d)_j$ for each local configuration j, yielding formation energy $E_f(d)$ for defect d. Once defect formation energy has been found for all fourteen defect types for compound $A_xB_yC_{1-x-y}D$, concentrations c(d) can be calculated using eq. 8. Once concentrations c(d) are calculated, eqs. 16, 17, and 18 can be populated. All four equations 15, 16, 17, and 18 are solved together. As in prior cases, the calculation results in calculated chemical potentials $u_A$, $u_B$, $u_C$, and $u_D$.

Iteration continues until the convergence criteria are satisfied. Again, on iterative passes after the first, the calculated chemical potentials $u_A$, $u_B$, $u_C$, and $u_D$ from the previous pass, or chemical potentials derived from them, become the provisional chemical potentials $u_A$, $u_B$, $u_C$, and $u_D$ for the next pass.

To find the terms for concentration c(d) for eqs. 12, 13 and 14, for passes after the first, for each defect type d we use the new provisional chemical potentials $u_A$, $u_B$, $u_C$, and $u_D$ in eq. 9 to calculate new formation energies $E_f(d)_j$ for each local configuration j, then use eq. 10 to sum these weighted averages to find a new formation energy $E_f(d)$ for that defect type d. This is done for each of the fourteen defect types. These formation energies $E_f(d)$ are then used in eq. 8 to find the new concentration c(d) for each defect type d. Now the four eqs. 15, 16, 17, and 18 can be solved again.

When the calculated chemical potentials from the solving of eqs. 15, 16, 17, and 18 satisfy the convergence criteria, iteration is finished. The Newton-Raphson method may be used, this time using a 4×4 Jacobian matrix. The calculated chemical potentials from the final pass, or chemical potentials derived from them, are the approximated chemical potentials resulting from the above-described embodiment of the present invention.

These approximated chemical potentials can be used to calculate defect formation energies. For a defect type, the approximated chemical potentials $u_A$, $u_B$, $u_C$, and $u_D$ are used in eq. 9 to find defect formation energy $E_f(d)_j$ for each local configuration. Then the formation energy $E_f(d)$ for defect type d is found by calculating a weighted sum using eq. 10.

Figure 4:
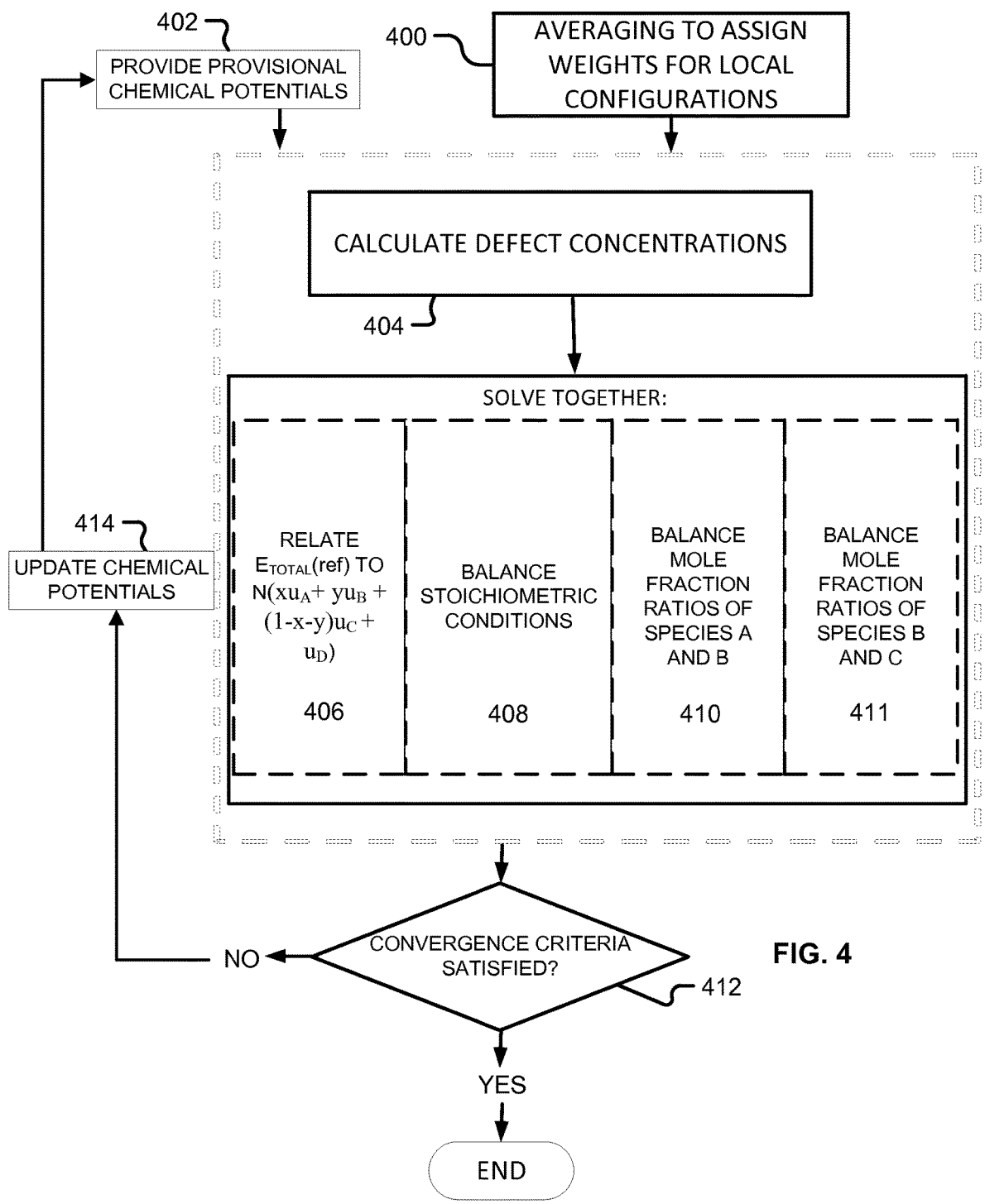
FIG. 4 illustrates a procedure to approximate chemical potentials of species A, B, C, and D in a quaternary compound of the form $A_xB_yC_{1-x-y}D$ according to embodiments of the present invention.

To summarize, referring to FIG. 4, before iteration, averaging (400) is performed to assign weights. Using provisional chemical potentials (402), defect concentrations are calculated (404), then equations 15, 16, 17 and 18 are solved together (406, 408, 410, 411). If convergence criteria are satisfied (412), approximation is finished. If not, the chemical potentials are updated (414) to provide new provisional chemical potentials (402) for the next pass.

For ease of explanation, only ternary and quaternary cases have been described in detail. It will be understood that the methods of the present invention could be extended to include higher-order III-V or II-VI compounds, including, as an example, $A_xB_yC_{1-x-y}D_zE_{1-z}$, with species A, B, and C sharing one site and species D and E sharing the other; other examples can be readily imagined. Modeling the examples provided herein, it will be apparent to the skilled practitioner how to modify the equations used to find chemical potentials and formation energy. Specifically:

1) Eq. 9 is modified to create an equation including a term for each species of the compound, 2) Eq. 5 is modified to create an equation including a term for each species, in the ratios as disclosed by its formula.

3) Eq. 6 is modified to create an equation balancing atomic density between the group III and group V sites (or, for example, in the case of a II-VI compound, between group II and group VI sites).

4) Eq. 7 is modified to create as many equations are required to balance mole fraction ratio. For example, for the compound $A_xB_yC_{1-x-y}D_zE_{1-z}$ mentioned above, three equations would be required: one balancing the mole fraction ratios of species A and B, a second balancing the mole fraction ratios of species B and C, and a third balancing the mole fraction ratios of species D and E.

To generalize, then, embodiments of the present invention can be used to approximate chemical potentials for ternary, quaternary, or higher-order III-V or II-VI compounds by solving three, four, or more equations together. The first of the three, four, or more equations relates total energy of a defect-free system to the sum of the provisional chemical potentials for each species, each times the number of atoms of that species. The second of the three, four, or more equations describes a stoichiometric balance relationship between total atomic density of all group III (or II) atoms and total atomic density of all group V (or VI) atoms. The remaining equations balance mole fraction ratios between species sharing a site.

Figure 5:
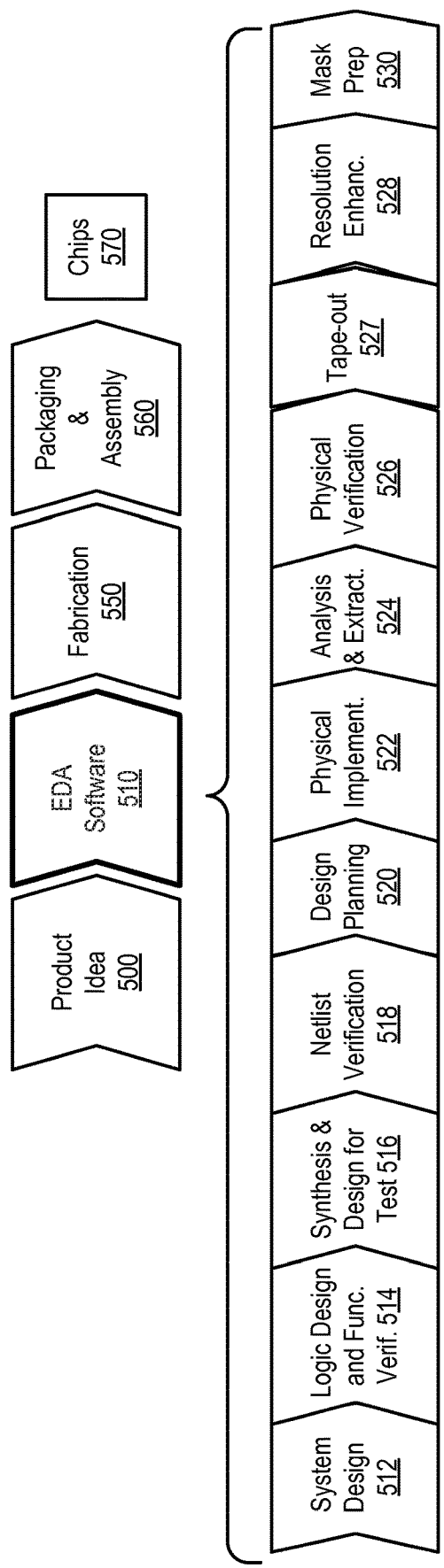
FIG. 5 shows a simplified representation of an illustrative integrated circuit design flow, which may encompass aspects of the present invention.

To provide context, recall that aspects of the invention provide calculation in support of an integrated circuit design flow. FIG. 5 shows a simplified representation of an illustrative digital integrated circuit design flow. At a high level, the process starts with the product idea (module 500) and is realized in an EDA (Electronic Design Automation) software design process (module 510). When the design is finalized, it can be taped out (module 527). At some point after tape out, the fabrication process (module 550) and packaging and assembly processes (module 560) occur resulting, ultimately, in finished integrated circuit chips (result 570).

The EDA software design process (module 510) is itself composed of a number of modules 512-530, shown in linear fashion for simplicity. In an actual integrated circuit design process, the particular design might have to go back through modules until certain tests are passed. Similarly, in any actual design process, these modules may occur in different orders and combinations. This description is therefore provided by way of context and general explanation rather than as a specific, or recommended, design flow for a particular integrated circuit.

A brief description of the component modules of the EDA software design process (module 510) will now be provided.

System design (module 512): The designers describe the functionality that they want to implement, they can perform what-if planning to refine functionality, check costs, etc. Hardware-software architecture partitioning can occur at this stage. Example EDA software products from Synopsys, Inc. that can be used at this module include Model Architect, Saber, System Studio, and DesignWare® products.

Logic design and functional verification (module 514): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this module include VCS, VERA, DesignWare®, Magellan, Formality, ESP and LEDA products.

Synthesis and design for test (module 516): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this module include Design Compiler®, Physical Compiler, DFT Compiler, Power Compiler, FPGA Compiler, TetraMAX, and DesignWare® products.

Netlist verification (module 518): At this module, the netlist is checked for compliance with timing constraints and for correspondence with the VHDL/Verilog source code. Example EDA software products from Synopsys, Inc. that can be used at this module include Formality, PrimeTime, and VCS products.

Design planning (module 520): Here, an overall floor plan for the chip is constructed and analyzed for timing and top-level routing. Example EDA software products from Synopsys, Inc. that can be used at this module include Astro and Custom Designer products.

Physical implementation (module 522): The placement (positioning of circuit elements) and routing (connection of the same) occurs at this module, as can selection of library cells to perform specified logic functions. Example EDA software products from Synopsys, Inc. that can be used at this module include the Astro, IC Compiler, and Custom Designer products.

Analysis and extraction (module 524): At this module, the circuit function is verified at a transistor level, this in turn permits what-if refinement. Example EDA software products from Synopsys, Inc. that can be used at this module include AstroRail, PrimeRail, PrimeTime, and Star-RCXT products.

Physical verification (module 526): At this module various checking functions are performed to ensure correctness for: manufacturing, electrical issues, lithographic issues, and circuitry. Example EDA software products from Synopsys, Inc. that can be used at this module include the Hercules product.

Tape-out (module 527): This module provides the "tape out" data to be used (after lithographic enhancements are applied if appropriate) for production of masks for lithographic use to produce finished chips. Example EDA software products from Synopsys, Inc. that can be used at this module include the IC Compiler and Custom Designer families of products.

Resolution enhancement (module 528): This module involves geometric manipulations of the layout to improve manufacturability of the design. Example EDA software products from Synopsys, Inc. that can be used at this module include Proteus, ProteusAF, and PSMGen products.

Mask data preparation (module 530): This module provides mask-making-ready "tape-out" data for production of masks for lithographic use to produce finished chips. Example EDA software products from Synopsys, Inc. that can be used at this module include the CATS® family of products.

The integrated circuit manufacturing flow includes a parallel flow, as follows:

(1) Develop individual process modules for manufacturing the integrated circuit. This can be modeled with EDA tools such as the Synopsys, Inc. tools "Sentaurus Process," "Sentaurus Topography," and "Sentaurus Lithography". The input information here includes the materials of the device being simulated, the process conditions like temperature, reactor ambient, implant energy, etc. The output information is the change in geometry or doping profiles or stress distribution. Chemical potentials and defect formation energies approximated using methods of the present invention can provide input to tools at this stage of the flow, for example.

(2) Integrate the individual process modules into the complete process flow. This can be modeled with EDA tools such as the Synopsys, Inc. tool "Sentaurus Process." The input information here is the collection of the process modules in the appropriate sequence. The output is the geometry, the doping profiles, and the stress distribution for the transistors and the space in between the transistors. Chemical potentials and defect formation energies approximated using methods of the present invention can provide input to tools at this stage of the flow, for example.

(3) Analyze performance of the transistor manufactured with this process flow. This can be done with EDA tools such as the Synopsys, Inc. tool "Sentaurus Device." The input information here is the output of module (3) and the biases applied to transistor terminals. The output information is the currents and capacitances for each bias combination.

(4) If necessary, modify the process modules and the process flow to achieve the desired transistor performance. This can be done iteratively by using tools such as the Synopsys, Inc. tools mentioned above.

Once the process flow is ready, it can be used for manufacturing multiple circuit designs coming from different fabless companies. The EDA flow 512-530 will be used by such fabless companies. The parallel flow described here can be used at a foundry to develop a process flow that can be used to manufacture designs coming from their fabless customers. A combination of the process flow and the mask preparation 530 are used to manufacture any particular circuit.

The technology described herein may be implemented in a system for evaluating candidate materials for fabrication of integrated circuits. The system includes one or more processor configured to perform operations implementing methods as described herein and any of the features and optional embodiments of the methods described.

The technology described herein may be implemented in non-transitory computer readable medium storing computer instructions for evaluating candidate materials for fabrication of integrated circuits. The non-transitory computer readable medium includes actions to implement methods as described herein and any of the features and optional embodiments of the methods described.

Figure 6:
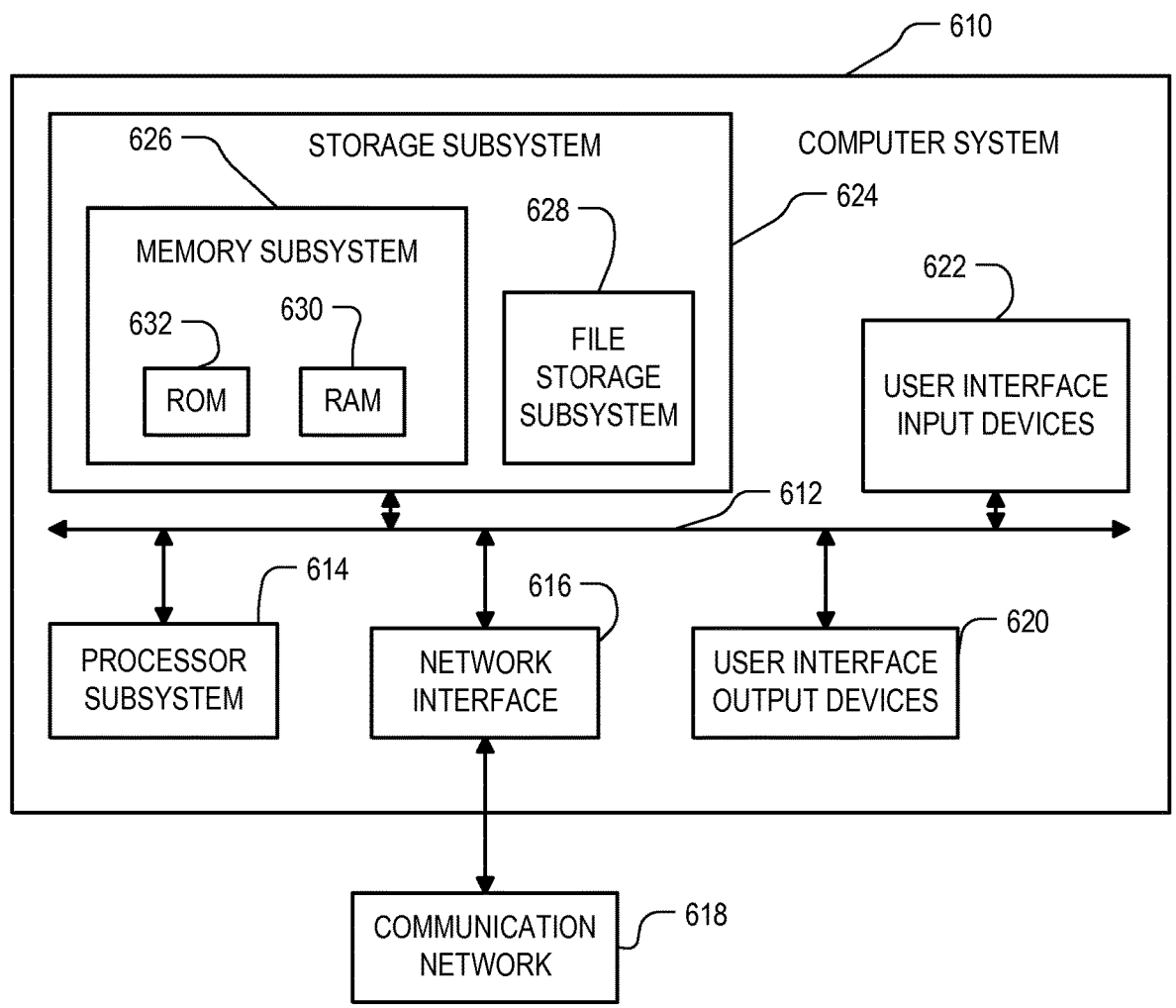
FIG. 6 is a simplified block diagram of a computer system that can be used to implement any of the methods and processes described herein.

FIG. 6 is a simplified block diagram of a computer system 610 that can be used to implement software to approximate chemical potentials, incorporating aspects of the present invention. While FIGS. 1 through 5 indicate individual components as carrying out specified operations, it will be appreciated that each component actually causes the computer system 610 to operate in the specified manner.

Computer system 610 typically includes a processor subsystem 614 which communicates with a number of peripheral devices via bus subsystem 612. These peripheral devices may include a storage subsystem 624, comprising a memory subsystem 626 and a file storage subsystem 628, user interface input devices 622, user interface output devices 620, and a network interface subsystem 616. The input and output devices allow user interaction with computer system 610. Network interface subsystem 616 provides an interface to outside networks, including an interface to communication network 618, and is coupled via communication network 618 to corresponding interface devices in other computer systems. Communication network 618 may comprise many interconnected computer systems and communication links. These communication links may be wireline links, optical links, wireless links, or any other mechanisms for communication of information, but typically it is an IP-based communication network. While in one embodiment, communication network 618 is the Internet, in other embodiments, communication network 618 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 622 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 610 or onto computer network 618.

User interface output devices 620 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 610 to the user or to another machine or computer system.

Storage subsystem 624 stores the basic programming and data constructs that provide the functionality of certain embodiments of the present invention. For example, the various modules implementing the functionality of certain embodiments of the invention may be stored in storage subsystem 624. These software modules are generally executed by processor subsystem 614.

Memory subsystem 626 typically includes a number of memories including a main random access memory (RAM) 630 for storage of instructions and data during program execution and a read only memory (ROM) 632 in which fixed instructions are stored. File storage subsystem 628 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 628. The host memory 626 contains, among other things, computer instructions which, when executed by the processor subsystem 614, cause the computer system to operate or perform functions as described herein. As used herein, processes and software that are said to run in or on "the host" or "the computer", execute on the processor subsystem 614 in response to computer instructions and data in the host memory subsystem 626 including any other local or remote storage for such instructions and data.

Bus subsystem 612 provides a mechanism for letting the various components and subsystems of computer system 610 communicate with each other as intended. Although bus subsystem 612 is shown schematically as a single bus, alternative embodiments of the bus subsystem may use multiple busses.

Computer system 610 itself can be of varying types including a personal computer, a portable computer, a workstation, a computer terminal, a network computer, a television, a mainframe, a server farm, or any other data processing system or user device. Due to the ever-changing nature of computers and networks, the description of computer system 610 depicted in FIG. 6 is intended only as a specific example for purposes of illustrating the preferred embodiments of the present invention. Many other configurations of computer system 610 are possible having more or less components than the computer system depicted in FIG. 6.

The applicant discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features.

In particular and without limitation, though many of the inventive aspects are described individually herein, it will be appreciated that many can be combined or used together with each other. All such combinations are intended to be included in the scope of this document.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated.

We claim:

1. A system for estimating defect formation energy of a candidate ternary, quaternary, or higher-order III-V semiconductor compound having a plurality of defect types, wherein at least two group III elements are distributed among group III sites of the compound, or at least two group V elements are distributed among group V sites of the compound, or both, the system comprising:
   a memory;
   a processor coupled to the memory, the processor configured to:
   approximate chemical potentials for each of the group III elements and each of the group V elements in the candidate semiconductor compound having the plurality of defect types by solving a set of at least three relationships together; and
   determine the defect formation energy of the candidate semiconductor compound with the plurality of defect types in dependence upon the approximated chemical potentials for each of the group III elements and each of the group V elements,
   wherein the first of the at least three relationships relates (1) total energy of a defect-free system ($E_{TOTAL}$(ref)) to (2) the sum, over all of the group III and group V elements, of (a) provisional chemical potential for the respective element, times (b) number of atoms of the respective element within a supercell,
   wherein the second of the at least three relationships describes a stoichiometric balance relationship between total atomic density of all group III atoms and total atomic density of all group V atoms within the supercell, and
   wherein the remaining ones of the at least three relationships each describe a member of the group consisting of (1) a mole fraction ratio balance relationship between group III atoms within the supercell, and (2) a mole fraction ratio balance relationship between group V atoms within the supercell,
   the system further using the determined defect formation energy in an evaluation of the semiconductor compound in an evaluation of its use for fabrication of integrated circuits.

2. The system of claim 1 wherein the compound is a ternary semiconductor ($A_xB_{1-x}C$) of species A, B and C, wherein either species A and B are group III elements and species C is a group V element, or species A and B are group V elements and species C is a group III element
   wherein, during the solving step, the at least three relationships can be written as three equations solved together to find approximated chemical potentials $u_A$, $u_B$, and $u_C$,
   wherein the first of the three equations relates (1) ($E_{TOTAL}$(ref)) to (2) the sum, for species A, B, and C, of (a) provisional chemical potentials $u_A$, $u_B$, or $u_C$, respectively, times (b) the number of atoms of species A, B, or C, respectively, within the supercell,
   wherein the second of three equations describes the stoichiometric balance relationship between total atomic density of all group III atoms and total atomic density of all group V atoms within the supercell, and wherein the third of the three equations describes a mole fraction ratio balance relationship between species A and B within the supercell.

3. The system of claim 2 wherein the first of the three equations can be written in the form $$E_{TOTAL}(\text{ref})=N(xu_A+(1-x)u_B+u_C)$$

wherein N is a number of formula units in the supercell.

4. The system of claim 2 wherein the solving step is performed numerically.

5. The system of claim 2 wherein the solving step is performed using Newton-Raphson iteration.

6. The system of claim 5 wherein the solving step comprises performing a plurality of passes of an iteration, the passes including a first pass and subsequent passes, and wherein, for the first pass, the provisional chemical potentials $u_A$, $u_B$, and $u_C$ are estimates, and for subsequent passes, chemical potentials $u_A$, $u_B$, and $u_C$ are approximations produced by the immediately prior pass.

7. The system of claim 2 wherein the processor is further configured, following the solving step, to determine defect formation energy in dependence upon the approximated chemical potentials $u_A$, $u_B$, and $u_C$ for the plurality of defect types.

8. The system of claim 7 wherein the step of determining defect formation energy $Ef(d)_j$ for a defect type d from the plurality of defect types at configuration j uses a further equation that can be written in the form $$E_f(d)_j=E_{TOTAL}(d)_j-E_{TOTAL}(\text{ref})+n1'u_A+n2'u_B+n3'u_C$$

wherein $E_{TOTAL}(d)_j$ is total energy of a system having the defect type d at configuration j, n1' is a difference in number of species A atoms between the defect-free system and the system having the defect type d, n2' is a difference in number of species B atoms between the defect-free system and the system having the defect type d, and n3' is a difference in number of species C atoms between the defect-free system and the system having the defect type d.

9. The system of claim 2 wherein the second and third equations account for concentration c(d) for a defect type d from the plurality of defect types, where the plurality of defect types include native interstitials $A_i$, $B_i$, and $C_i$, native vacancies $V_A$, $V_B$, and $V_C$, and native antisites $A_C$, $B_C$, $C_A$, and $C_B$.

10. The system of claim 9 wherein the second of the three equations can be written in the form $$\frac{N}{Vol}+(c(A_i)+c(A_C)-c(V_A)-c(C_A))+(c(B_i)+c(B_C)-c(V_B)-c(C_B))=$$
$$\frac{N}{Vol}+(c(C_i)-c(V_C)+c(C_A)-c(A_C)+c(B_C)-c(B_C))$$

wherein N is number of formula units in the supercell and Vol is volume of the supercell.

11. The system of claim 9 wherein the third of the three equations can be written in the form $$(1-x)\left(\frac{N_A}{Vol}+c(A_i)+c(A_C)-c(V_A)-c(C_A)\right)=$$

-continued
$$x\left(\frac{N_B}{Vol}+c(B_i)+c(B_C)-c(V_B)-c(C_B)\right)$$

wherein $N_A$ is number of atoms of species A in the supercell, $N_B$ is number of atoms of species B in the supercell, and Vol is volume of the supercell.

12. The system of claim 9 wherein species A, B, and C are bonded in a crystalline structure, and further comprising, before the solving step, performing an averaging step for each of the plurality of defect types to assign weights reflecting a relative probability of each of a plurality of local configurations for each respective defect type from the plurality of defect types within the crystalline structure.

13. The system of claim 12 wherein the averaging step is performed using Boltzmann averaging.

14. The system of claim 12 wherein, during the solving step, the weights are used to calculate concentrations c(d).

15. The system of claim 14 wherein the averaging step is performed using Boltzmann averaging, wherein for a j'th one of the local configurations, the weight reflecting the relative probability of the j'th local configuration is found by solving an equation that can be written in the form $$W_j=N_j\exp(-E_{CR}(d)_j/k_BT)/\Sigma_i(N_i\exp(-E_{CR}(d)_i/k_BT)),$$

wherein $W_j$ is the weight for the j'th local configuration,
wherein creation energy $E_{CR}(d)_j$ for the defect type d at configuration j can be written in the form $$E_{CR}(d)_j=E_{TOTAL}(d)_j-E_{TOTAL}(\text{ref}),$$

$E_{TOTAL}(d)_j$ being the total energy of a system having the defect type d at configuration j,
wherein $k_B$ is Boltzmann's constant and T is temperature,
wherein $N_j$ equals M times the probability that the defect type d occurs at configuration j,
wherein $N_i$ equals M times the probability that the defect type d occurs at configuration i, and
wherein M is a constant of proportionality.

16. The system of claim 14 wherein the averaging step is performed using Boltzmann averaging,
wherein for a j'th one of the local configurations, the weight reflecting the relative probability of the j'th local configuration is found by solving an equation that can be written in the form $$W_j=\exp(-E_{CR}(d)_j/k_BT)/\Sigma_i(\exp(-E_{CR}(d)_i/k_BT)),$$

wherein $W_j$ is the weight for the j'th local configuration,
wherein creation energy $E_{CR}(d)_j$ for the defect type d at configuration j can be written in the form $$E_{CR}(d)_j=E_{TOTAL}(d)_j-E_{TOTAL}(\text{ref}),$$

$E_{TOTAL}(d)_j$ being the total energy of a system having the defect type d at configuration j, and
wherein $k_B$ is Boltzmann's constant and T is temperature.

17. The system of claim 1 wherein the compound is a quaternary III-V semiconductor of species A, B, C, and D, wherein A and B, or A and B and C, share either one of the group III sites or one of the group V sites, wherein, during the solving step, the at least three relationships can be written as four equations solved together to find approximated chemical potentials $u_A$, $u_B$, $u_C$, and $u_D$, wherein the first of the four equations relates (1) ($E_{TOTAL}$ (ref)) to (2) the sum, for species A, B, C, and D of (a) provisional chemical potentials $u_A$, $u_B$, $u_C$, or $u_D$, respectively, times (b) the number of atoms of species A, B, C, or D, respectively, within the supercell, wherein the second of four equations describes the stoichiometric balance relationship between total atomic density of all group III atoms and total atomic density of all group V atoms within the supercell, and wherein the third and the fourth of the four equations each describes a member of the group consisting of (1) a mole fraction ratio balance relationship between group III atoms or (2) a mole fraction ratio balance relationship between group V atoms within the supercell.

18. The system of claim 17, wherein the quaternary III-V semiconductor of species A, B, C, and D is of the form $A_xB_{1-x}C_yD_{1-y}$, wherein the third of the four equations describes a mole fraction ratio balance relationship between species A and B within the supercell, and wherein the fourth of the four equations describes a mole fraction ratio balance relationship between species C and D within the supercell.

19. The system of claim 17, wherein the quaternary semiconductor of species A, B, C, and D is of the form $A_xB_yC_{1-x-y}D$ wherein the third of the four equations describes a mole fraction ratio balance relationship between species A and B within the supercell, and wherein the fourth of the four equations describes a mole fraction ratio balance relationship between species B and C within the supercell.

20. The system of claim 1 wherein the compound is a quaternary semiconductor $(A_xB_{1-x}C_yD_{1-y})$ of species A, B, C, and D, wherein either species A and B are group III elements and species C and D are group V elements, or species A and B are group V elements and species C and D are group III elements, wherein, during the solving step, the at least three relationships can be written as four equations solved together to find approximated chemical potentials $u_A$, $u_B$, $u_C$, and $u_D$, wherein the first of the four equations relates (1) ($E_{TOTAL}$ (ref)) to (2) the sum, for species A, B, C, and D, of (a) provisional chemical potentials $u_A$, $u_B$, $u_C$, or $u_D$, respectively, times (b) the number of atoms of species A, B, C, or D, respectively, within the supercell, wherein the second of four equations describes the stoichiometric balance relationship between total atomic density of all group III atoms and total atomic density of all group V atoms within the supercell, wherein the third of the four equations describes a mole fraction ratio balance relationship between species A and B within the supercell, and wherein the fourth of the four equations describes a mole fraction ratio balance relationship between species C and D within the supercell.

21. The system of claim 20 wherein the first of the four equations can be written in the form $$E_{TOTAL}(\text{ref})=N(xu_A+(1-x)u_B+yu_C+(1-y)u_D)$$

wherein N is a number of formula units in the supercell.

22. The system of claim 20 wherein the solving step is performed numerically.

23. The system of claim 20 wherein the solving step is performed using Newton-Raphson iteration.

24. The system of claim 23 wherein the solving step comprises performing a plurality of passes of an iteration, the passes including a first pass and subsequent passes, and wherein, for the first pass, the provisional chemical potentials $u_A$, $u_B$, $u_C$ and $u_D$ are estimates, and for subsequent passes, chemical potentials $u_A$, $u_B$, $u_C$, and $u_D$ are approximations produced by the immediately prior pass.

25. The system of claim 20 wherein the processor, following the solving step, determines defect formation energy in dependence upon the approximated chemical potentials $u_A$, $u_B$, and $u_C$, and $u_D$ for a defect type d in the plurality of defect types.

26. The system of claim 25 wherein the step of determining defect formation energy $Ef(d)_j$ for the defect type d at configuration j uses a further equation that can be written in the form $$E_f(d)_j = E_{TOTAL}(d)_j - E_{TOTAL}(\text{ref}) + n1'u_A + n2'u_B + n3'u_C + n4'u_D$$

wherein $E_{TOTAL}(d)_j$ is total energy of a system having the defect type d at configuration j, n1' is a difference in number of species A atoms between the defect-free system and the system having the defect type d, n2' is a difference in number of species B atoms between the defect-free system and the system having the defect type d, n3' is a difference in number of species C atoms between the defect-free system and the system having the defect type d, and n4' is a difference in number of species D atoms between the defect-free system and the system having the defect type d.

27. The system of claim 20 wherein the second, third, and fourth equations account for concentration c(d) for a defect type d from the a plurality of defect types, where the plurality of defect types includes native interstitials $A_i$, $B_i$, $C_i$, and $D_i$, native vacancies $V_A$, $V_B$, $V_C$, $V_D$, and native antisites $A_C$, $A_D$, $B_C$, $B_D$, $C_A$, $C_B$, $D_A$, and $D_B$.

28. The system of claim 27 wherein the second of the four equations can be written in the form $$\frac{N}{Vol} + (c(A_i) - c(V_A) + c(A_C) - c(C_A) + c(A_D) - c(D_A)) +$$
$$(c(B_i) - c(V_B) + c(B_C) - c(C_B) + c(B_D) - c(D_B)) =$$
$$\frac{N}{Vol} + (c(C_i) - c(V_C) + c(C_A) - c(A_C) + c(C_B) - c(B_C)) +$$
$$(c(D_i) - c(V_D) + c(D_A) - c(A_D) + c(D_B) - c(B_D))$$

wherein N is number of formula units in the supercell and Vol is volume of the supercell.

29. The system of claim 27 wherein the third of the four equations can be written in the form $$(1-x)\left(\frac{N_A}{Vol} + c(A_i) - c(V_A) + c(A_C) - c(C_A) + c(A_D) - c(D_A)\right) =$$
$$x\left(\frac{N_B}{Vol} + c(B_i) - c(V_B) + c(B_C) - c(C_B) + c(B_D) - c(D_B)\right)$$

wherein $N_A$ is number of atoms of species A in the supercell, $N_B$ is number of atoms of species B in the supercell, and Vol is volume of the supercell.

30. The system of claim 27 wherein the fourth of the four equations can be written in the form $$(1-y)\left(\frac{N_C}{Vol} + c(C_i) - c(V_C) + c(C_A) - c(A_C) + c(C_B) - c(B_C)\right) =$$

-continued $$y\left(\frac{N_D}{Vol} + c(D_i) - c(V_D) + c(D_A) - c(A_D) + c(D_B) - c(B_D)\right)$$

wherein $N_C$ is number of atoms of species C in the supercell, $N_D$ is number of atoms of species D in the supercell, and Vol is volume of the supercell.

31. The system of claim 27 wherein species A, B, C, and D are bonded in a crystalline structure, and further comprising, before the solving step, performing an averaging step for each defect type of the plurality of defect types to assign weights reflecting a relative probability of each of a plurality of local configurations for the respective defect type within the crystalline structure.

32. The system of claim 31 wherein the averaging step is performed using Boltzmann averaging.

33. The system of claim 31 wherein, during the solving step, the weights are used to calculate concentrations c(d).

34. The system of claim 31
wherein the averaging step is performed using Boltzmann averaging,
wherein for a j'th one of the local configurations, the weight reflecting the relative probability of the j'th local configuration is found by solving an equation that can be written in the form $$W_j = N_j \exp(-E_{CR}(d)_j/k_B T)/\Sigma_i (N_i \exp(-E_{CR}(d)_i/k_B T)),$$

wherein $W_j$ is the weight for the j'th local configuration,
wherein creation energy $E_{CR}(d)_j$ for defect type d at configuration j can be written in the form $$E_{CR}(d)_j = E_{TOTAL}(d)_j - E_{TOTAL}(\text{ref}),$$

$E_{TOTAL}(d)_j$ being the total energy of a system having the defect type d at configuration j,
wherein $k_B$ is Boltzmann's constant and T is temperature,
wherein $N_j$ equals M times the probability that the defect type d occurs at configuration j,
wherein $N_i$ equals M times the probability that the defect type d occurs at configuration i, and
wherein M is a constant of proportionality.

35. The system of claim 31
wherein the averaging step is performed using Boltzmann averaging,
wherein for a j'th one of the local configurations, the weight reflecting the relative probability of the j'th local configuration is found by solving an equation that can be written in the form $$W_j = \exp(-E_{CR}(d)_j/k_B T)/\Sigma_i (\exp(-E_{CR}(d)_i/k_B T)),$$

wherein $W_j$ is the weight for the j'th local configuration,
wherein creation energy $E_{CR}(d)_j$ for defect type d at configuration j can be written in the form $$E_{CR}(d)_j = E_{TOTAL}(d)_j - E_{TOTAL}(\text{ref}),$$

$E_{TOTAL}(d)_j$ being the total energy of a system having the defect type d at configuration j, and
wherein $k_B$ is Boltzmann's constant and T is temperature.

36. The system of claim 1 wherein the compound is a quaternary semiconductor $(A_x B_y C_{1-x-y} D)$ of species A, B, C, and D, wherein either species A, B, and C are group III elements and species D is a group V element, or species A, B, and C are group V elements and species D is a group III element,
wherein, during the solving step, the at least three relationships can be written as four equations solved together to find approximated chemical potentials $u_A$, $u_B$, $u_C$, and $u_D$,
wherein the first of the four equations relates (1) ($E_{TOTAL}$(ref)) to (2) the sum, for species A, B, C, and D, of (a) provisional chemical potentials $u_A$, $u_B$, $u_C$, or $u_D$, respectively, times (b) the number of atoms of species A, B, C, or D, respectively, within the supercell,
wherein the second of four equations describes the stoichiometric balance relationship between total atomic density of all group III atoms and total atomic density of all group V atoms within the supercell,
wherein the third of the four equations describes a mole fraction ratio balance relationship between species A and B, and
wherein the fourth of the four equations describes a mole fraction ratio balance relationship between species B and C.

37. The system of claim 36 wherein the first of the four equations can be written in the form $$E_{TOTAL}(\text{ref}) = N(xu_A + yu_B + (1-x-y)u_C + u_D)$$

wherein N is a number of formula units in the supercell.

38. The system of claim 36 wherein the solving step is performed numerically.

39. The system of claim 36 wherein the solving step is performed using Newton-Raphson iteration.

40. The system of claim 39 wherein the solving step comprises performing a plurality of passes of an iteration, the passes including a first pass and subsequent passes, and wherein, for the first pass, the provisional chemical potentials $u_A$, $u_B$, $u_C$ and $u_D$ are estimates, and for subsequent passes, chemical potentials $u_A$, $u_B$, $u_C$, and $u_D$ are approximations produced by the immediately prior pass.

41. The system of claim 36 wherein the processor, following the solving step, determines defect formation energy in dependence upon the approximated chemical potentials $u_A$, $u_B$, $u_C$, and $u_D$ for the plurality of defect types.

42. The system of claim 41 wherein the step of determining defect formation energy $Ef(d)_j$ for a defect type d at configuration j uses a further equation that can be written in the form $$E_f(d)_j = E_{TOTAL}(d)_j - E_{TOTAL}(\text{ref}) + n1'u_A + n2'u_B + n3'u_C + n4'u_D$$

wherein $E_{TOTAL}(d)_j$ is total energy of a system having the defect type d at configuration j,
n1' is a difference in number of species A atoms between the defect-free system and the system having the defect type d,
n2' is a difference in number of species B atoms between the defect-free system and the system having the defect type d,
n3' is a difference in number of species C atoms between the defect-free system and the system having the defect type d, and
n4' is a difference in number of species D atoms between the defect-free system and the system having the defect type d.

43. The system of claim 36 wherein the second, third, and fourth equations account for concentration c(d) for each defect type d of a plurality of defect types, where the plurality of defect types includes native interstitials $A_i$, $B_i$, $C_i$, and $D_i$, native vacancies $V_A$, $V_B$, $V_C$, $V_D$, and native antisites $A_D$, $B_D$, $C_D$, $D_A$, and $D_B$ and $D_C$.

44. The system of claim 43 wherein the second of the four equations can be written in the form $$\frac{N}{Vol} + c(A_i) + c(A_D) - c(V_A) - c(D_A) + c(B_i) +$$
$$c(B_D) - c(V_B) - c(D_B) + c(C_i) + c(C_D) - c(V_C) - c(D_C) =$$
$$\frac{N}{Vol} + c(D_i) - c(V_D) + c(D_A) - c(A_D) + c(D_B) - c(B_D) + c(D_C) - c(C_D)$$

wherein N is number of formula units in the supercell and Vol is volume of the supercell.

45. The system of claim 43 wherein the third of the four equations can be written in the form $$y\left(\frac{N_A}{Vol} + c(A_i) - c(V_A) + c(A_D) - c(D_A)\right) =$$
$$x\left(\frac{N_B}{Vol} + c(B_i) - c(V_B) + c(B_D) - c(D_B)\right)$$

wherein $N_A$ is number of atoms of species A in the supercell, $N_B$ is number of atoms of species B in the supercell, and Vol is volume.

46. The system of claim 43 wherein the fourth of the four equations can be written in the form $$(1-x-y)\left(\frac{N_B}{Vol} + c(B_i) - c(V_B) + c(B_D) - c(D_B)\right) =$$
$$y\left(\frac{N_C}{Vol} + c(C_i) - c(V_C) + c(C_D) - c(D_C)\right)$$

wherein $N_B$ is number of atoms of species B in the supercell, $N_C$ is number of atoms of species C in the supercell, and Vol is volume.

47. The system of claim 43 wherein species A, B, C, and D are bonded in a crystalline structure, and further comprising, before the solving step, performing an averaging step for each defect type of the plurality of defect types to assign weights reflecting a relative probability of each of a plurality of local configurations for each respective defect type within the crystalline structure.

48. The system of claim 47 wherein the averaging step is performed using Boltzmann averaging.

49. The system of claim 47 wherein, during the solving step, the weights are used to calculate concentrations c(d).

50. The system of claim 49
wherein the averaging step is performed using Boltzmann averaging,
wherein for a j'th one of the local configurations, the weight reflecting the relative probability of the j'th local configuration is found by solving an equation that can be written in the form $$W_j = N_j \exp(-E_{CR}(d)_j/k_B T)/\Sigma_i (N_i \exp(-E_{CR}(d)_i/k_B T)),$$

wherein $W_j$ is the weight for the j'th local configuration, wherein creation energy $E_{CR}(d)_j$ for the defect type d at configuration j can be written in the form $$E_{CR}(d)_j = E_{TOTAL}(d)_j - E_{TOTAL}(\text{ref}),$$

$E_{TOTAL}(d)_j$ being the total energy of a system having the defect type d at configuration j,
wherein $k_B$ is Boltzmann's constant and T is temperature,
wherein $N_j$ equals M times the probability that the defect type d occurs at configuration j,
wherein $N_i$ equals M times the probability that the defect type d occurs at configuration i, and wherein M is a constant of proportionality.

51. The system of claim 49
wherein the averaging step is performed using Boltzmann averaging,
wherein for a j'th one of the local configurations, the weight reflecting the relative probability of the j'th local configuration is found by solving an equation that can be written in the form $$W_j = \exp(-E_{CR}(d)_j/k_B T)/\Sigma_i (\exp(-E_{CR}(d)_i/k_B T)),$$

wherein $W_j$ is the weight for the j'th local configuration, wherein creation energy $E_{CR}(d)_j$ for the defect type d at configuration j can be written in the form $$E_{CR}(d)_j = E_{TOTAL}(d)_j - E_{TOTAL}(\text{ref})),$$

$E_{TOTAL}(d)_j$ being the total energy of a system having the defect type d at configuration j, and
wherein $k_B$ is Boltzmann's constant and T is temperature.

52. A non-transitory computer readable medium having stored thereon a plurality of software code portions for estimating defect formation energy of a candidate ternary, quaternary, or higher-order III-V semiconductor compound having a plurality of defect types, wherein at least two group III elements are distributed among group III sites of the compound, or at least two group V elements are distributed among group V sites of the compound, or both, the software code portions defining logic for:
approximating chemical potentials for each of the group III elements and each of the group V elements in the candidate semiconductor compound having the plurality of defect types by solving a set of at least three relationships together; and
determining the defect formation energy of the candidate semiconductor compound with the plurality of defect types in dependence upon the approximated chemical potentials for each of the group III elements and each of the group V elements,
wherein the first of the at least three relationships relates (1) total energy of a defect-free system ($E_{TOTAL}(\text{ref})$) to (2) the sum, over all of the group III and group V elements, of (a) provisional chemical potential for the respective element, times (b) number of atoms of the respective element within a supercell,
wherein the second of the at least three relationships describes a stoichiometric balance relationship between total atomic density of all group III atoms and total atomic density of all group V atoms within the supercell, and
wherein the remaining ones of the at least three relationships each describe a member of the group consisting of (1) a mole fraction ratio balance relationship between group III atoms within the supercell, and (2) a mole fraction ratio balance relationship between group V atoms within the supercell.

53. The computer readable medium of claim 51 wherein the compound is a ternary semiconductor ($A_x B_{1-x} C$) of species A, B and C, wherein either species A and B are group III elements and species C is a group V element, or species A and B are group V elements and species C is a group III element
wherein, during the solving step, the at least three relationships can be written as three equations solved together to find approximated chemical potentials $u_A$, $u_B$, and $u_C$,
wherein the first of the three equations relates (1) ($E_{TOTAL}(\text{ref})$) to (2) the sum, for species A, B, and C, of (a) provisional chemical potentials $u_A$, $u_B$, or $u_C$, respectively, times (b) the number of atoms of species A, B, or C, respectively, within the supercell, wherein the second of three equations describes the stoichiometric balance relationship between total atomic density of all group III atoms and total atomic density of all group V atoms within the supercell, and wherein the third of the three equations describes a mole fraction ratio balance relationship between species A and B within the supercell.

54. The computer readable medium of claim 51 wherein the compound is a quaternary III-V semiconductor of species A, B, C, and D, wherein A and B, or A and B and C, share either one of the group III sites or one of the group V sites, wherein, during the solving step, the at least three relationships can be written as four equations solved together to find approximated chemical potentials $u_A$, $u_B$, $u_C$, and $u_D$, wherein the first of the four equations relates (1) ($E_{TOTAL}$(ref)) to (2) the sum, for species A, B, C, and D of (a) provisional chemical potentials $u_A$, $u_B$, $u_C$, or $u_D$, respectively, times (b) the number of atoms of species A, B, C, or D, respectively, within the supercell, wherein the second of three equations describes the stoichiometric balance relationship between total atomic density of all group III atoms and total atomic density of all group V atoms within the supercell, and wherein the third and the fourth of the four equations each describes a member of the group consisting of (1) a mole fraction ratio balance relationship between group III atoms or (2) a mole fraction ratio balance relationship between group V atoms within the supercell.

55. The computer readable medium of claim 52 wherein the compound is a quaternary semiconductor ($A_xB_{1-x}C_yD_{1-y}$) of species A, B, C, and D, wherein either species A and B are group III elements and species C and D are group V elements, or species A and B are group V elements and species C and D are group III elements, wherein, during the solving step, the at least three relationships can be written as four equations solved together to find approximated chemical potentials $u_A$, $u_B$, $u_C$, and $u_D$, wherein the first of the four equations relates (1) ($E_{TOTAL}$(ref)) to (2) the sum, for species A, B, C, and D, of (a) provisional chemical potentials $u_A$, $u_B$, $u_C$, or $u_D$, respectively, times (b) the number of atoms of species A, B, C, or D, respectively, within the supercell, wherein the second of four equations describes the stoichiometric balance relationship between total atomic density of all group III atoms and total atomic density of all group V atoms within the supercell, wherein the third of the four equations describes a mole fraction ratio balance relationship between species A and B within the supercell, and wherein the fourth of the four equations describes a mole fraction ratio balance relationship between species C and D within the supercell.

56. The computer readable medium of claim 51 wherein the compound is a quaternary semiconductor ($A_xB_yC_{1-x-y}D$) of species A, B, C, and D, wherein either species A, B, and C are group III elements and species D is a group V element, or species A, B, and C are group V elements and species D is a group III element, wherein, during the solving step, the at least three relationships can be written as four equations solved together to find approximated chemical potentials $u_A$, $u_B$, $u_C$, and $u_D$, wherein the first of the four equations relates (1) ($E_{TOTAL}$(ref)) to (2) the sum, for species A, B, C, and D, of (a) provisional chemical potentials $u_A$, $u_B$, $u_C$, or $u_D$, respectively, times (b) the number of atoms of species A, B, C, or D, respectively, within the supercell, wherein the second of four equations describes the stoichiometric balance relationship between total atomic density of all group III atoms and total atomic density of all group V atoms within the supercell, wherein the third of the four equations describes a mole fraction ratio balance relationship between species A and B, and wherein the fourth of the four equations describes a mole fraction ratio balance relationship between species B and C.

57. A method for estimating defect formation energy of a candidate ternary, quaternary, or higher-order III-V semiconductor compound having a plurality of defect types, wherein at least two group III elements are distributed among group III sites of the compound, or at least two group V elements are distributed among group V sites of the compound, or both, the method comprising the step of:

approximating chemical potentials for each of the group III elements and each of the group V elements in the candidate semiconductor compound having the plurality of defect types by solving a set of at least three relationships together;

determining the defect formation energy of the candidate semiconductor compound with the plurality of defect types in dependence upon the approximated chemical potentials for each of the group III elements and each of the group V elements; and using the determined defect formation energy in an evaluation of the candidate semiconductor compound with the plurality of defect types in an evaluation of its use for fabrication of integrated circuits, wherein the first of the at least three relationships relates (1) total energy of a defect-free system ($E_{TOTAL}$(ref)) to (2) the sum, over all of the group III and group V elements, of (a) provisional chemical potential for the respective element, times (b) number of atoms of the respective element within a supercell, wherein the second of the at least three relationships describes a stoichiometric balance relationship between total atomic density of all group III atoms and total atomic density of all group V atoms within the supercell, and wherein the remaining ones of the at least three relationships each describe a member of the group consisting of (1) a mole fraction ratio balance relationship between group III atoms within the supercell, and (2) a mole fraction ratio balance relationship between group V atoms within the supercell.

58. The method of claim 57 wherein the compound is a ternary semiconductor ($A_xB_{1-x}C$) of species A, B and C, wherein either species A and B are group III elements and species C is a group V element, or species A and B are group V elements and species C is a group III element wherein, during the solving step, the at least three relationships can be written as three equations solved together to find approximated chemical potentials $u_A$, $u_B$, and $u_C$, wherein the first of the three equations relates (1) ($E_{TOTAL}$(ref)) to (2) the sum, for species A, B, and C, of (a) provisional chemical potentials $u_A$, $u_B$, or $u_C$, respectively, times (b) the number of atoms of species A, B, or C, respectively, within the supercell, wherein the second of three equations describes the stoichiometric balance relationship between total atomic density of all group III atoms and total atomic density of all group V atoms within the supercell, and wherein the third of the three equations describes a mole fraction ratio balance relationship between species A and B within the supercell.

59. The method of claim 57 wherein the compound is a quaternary III-V semiconductor of species A, B, C, and D, wherein A and B, or A and B and C, share either one of the group III sites or one of the group V sites, wherein, during the solving step, the at least three relationships can be written as four equations solved together to find approximated chemical potentials $u_A$, $u_B$, $u_C$, and $u_D$, wherein the first of the four equations relates (1) ($E_{TOTAL}$ (ref)) to (2) the sum, for species A, B, C, and D of (a) provisional chemical potentials $u_A$, $u_B$, $u_C$, or $u_D$, respectively, times (b) the number of atoms of species A, B, C, or D, respectively, within the supercell, wherein the second of three equations describes the stoichiometric balance relationship between total atomic density of all group III atoms and total atomic density of all group V atoms within the supercell, and wherein the third and the fourth of the four equations each describes a member of the group consisting of (1) a mole fraction ratio balance relationship between group III atoms or (2) a mole fraction ratio balance relationship between group V atoms within the supercell.

60. The method of claim 57 wherein the compound is a quaternary semiconductor ($A_xB_{1-x}C_yD_{1-y}$) of species A, B, C, and D, wherein either species A and B are group III elements and species C and D are group V elements, or species A and B are group V elements and species C and D are group III elements, wherein, during the solving step, the at least three relationships can be written as four equations solved together to find approximated chemical potentials $u_A$, $u_B$, $u_C$, and $u_D$, wherein the first of the four equations relates (1) ($E_{TOTAL}$ (ref)) to (2) the sum, for species A, B, C, and D, of (a) provisional chemical potentials $u_A$, $u_B$, $u_C$, or $u_D$, respectively, times (b) the number of atoms of species A, B, C, or D, respectively, within the supercell, wherein the second of four equations describes the stoichiometric balance relationship between total atomic density of all group III atoms and total atomic density of all group V atoms within the supercell, wherein the third of the four equations describes a mole fraction ratio balance relationship between species A and B within the supercell, and wherein the fourth of the four equations describes a mole fraction ratio balance relationship between species C and D within the supercell.

61. The method of claim 57 wherein the compound is a quaternary semiconductor ($A_xB_yC_{1-x-y}D$) of species A, B, C, and D, wherein either species A, B, and C are group III elements and species D is a group V element, or species A, B, and C are group V elements and species D is a group III element, wherein, during the solving step, the at least three relationships can be written as four equations solved together to find approximated chemical potentials $u_A$, $u_B$, $u_C$, and $u_D$, wherein the first of the four equations relates (1) ($E_{TOTAL}$ (ref)) to (2) the sum, for species A, B, C, and D, of (a) provisional chemical potentials $u_A$, $u_B$, $u_C$, or $u_D$, respectively, times (b) the number of atoms of species A, B, C, or D, respectively, within the supercell, wherein the second of four equations describes the stoichiometric balance relationship between total atomic density of all group III atoms and total atomic density of all group V atoms within the supercell, wherein the third of the four equations describes a mole fraction ratio balance relationship between species A and B, and wherein the fourth of the four equations describes a mole fraction ratio balance relationship between species B and C.

* * * * *